US012702034B2

(12) United States Patent
Lee et al.

(10) Patent No.:    US 12,702,034 B2
(45) Date of Patent:        Aug. 4, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Jaeean Lee, Suwon-si (KR); Dahee Kim, Suwon-si (KR); Taehoon Lee, Suwon-si (KR); Gyujin Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 137 days.

(21) Appl. No.: 18/368,640

(22) Filed: Sep. 15, 2023

(65) Prior Publication Data

US 2024/0347487 A1      Oct. 17, 2024

(30) Foreign Application Priority Data

Nov. 1, 2022    (KR) ........................ 10-2022-0143559
Nov. 21, 2022    (KR) ........................ 10-2022-0155988

(51) Int. Cl.
*H01L 23/00*        (2006.01)
*H01L 23/31*        (2006.01)
(Continued)

(52) U.S. Cl.
CPC ........ *H10W 70/685* (2026.01); *H10W 74/117* (2026.01); *H10W 90/401* (2026.01);
(Continued)

(58) Field of Classification Search
CPC ................. H01L 24/05; H01L 23/3128; H01L 23/49822; H01L 23/49833; H01L 24/06; H01L 24/08; H01L 23/49838; H01L 24/03; H01L 24/16; H01L 24/32; H01L 24/48; H01L 24/73; H01L 2224/03462;
(Continued)

(56) References Cited

U.S. PATENT DOCUMENTS 9,589,903 B2    3/2017    Chen et al.
9,947,626 B2    4/2018    Chen et al.
(Continued)

FOREIGN PATENT DOCUMENTS

JP        6137454 A    9/2014
JP        7066403 A    7/2019
(Continued)

*Primary Examiner* — Tong-Ho Kim
(74) *Attorney, Agent, or Firm* — Fish & Richardson P.C.

(57)        ABSTRACT

An upper redistribution wiring layer of a semiconductor package includes a protective layer provided on at least one upper insulating layer and having an opening that exposes at least a portion of an uppermost redistribution wiring among second redistribution wirings, and a bonding pad provided on the uppermost redistribution wiring through the opening. The bonding pad includes a first plating pattern formed on the uppermost redistribution wiring, the first plating pattern including a via pattern provided in the opening and a pad pattern formed on the via pattern to be exposed from the opening, a second plating pattern on the second plating pattern, and a third plating pattern on the second plating pattern.

16 Claims, 36 Drawing Sheets

(51) Int. Cl.

| | |
|---|---|
| *H01L 23/498* | (2006.01) |
| *H10W 70/685* | (2026.01) |
| *H10W 74/10* | (2026.01) |
| *H10W 90/00* | (2026.01) |
| *H10W 70/65* | (2026.01) |
| *H10W 72/00* | (2026.01) |
| *H10W 72/90* | (2026.01) |

(52) U.S. Cl.

CPC ...... *H10W 70/65* (2026.01); *H10W 72/01935* (2026.01); *H10W 72/884* (2026.01); *H10W 72/922* (2026.01); *H10W 72/927* (2026.01); *H10W 72/952* (2026.01); *H10W 74/10* (2026.01); *H10W 90/724* (2026.01); *H10W 90/732* (2026.01); *H10W 90/734* (2026.01); *H10W 90/754* (2026.01); *H10W 90/794* (2026.01)

(58) Field of Classification Search

CPC . H01L 2224/05548; H01L 2224/05644; H01L 2224/05647; H01L 2224/05655; H01L 2224/0601; H01L 2224/08225; H01L 2224/16225; H01L 2224/32145; H01L 2224/32225; H01L 2224/48225; H01L 2224/73265; H01L 2924/1815; H01L 23/49816; H01L 23/5389; H01L 24/19; H01L 24/20; H01L 24/04; H01L 23/13; H01L 23/3107; H01L 23/3171; H01L 23/482; H01L 25/105; H01L 2224/02331; H01L 2224/02333; H01L 2224/0235; H01L 2224/02373; H01L 2224/02379; H01L 2224/02381; H01L 2224/0239; H01L 2225/1041; H01L 2225/1058

USPC .......................................................... 257/734

See application file for complete search history.

(56) References Cited

U.S. PATENT DOCUMENTS

| | | | | |
|---|---|---|---|---|
| 10,157,854 | B2 | 12/2018 | Chen et al. | |
| 10,510,678 | B2 | 12/2019 | Chen et al. | |
| 10,770,428 | B2 | 9/2020 | Yu et al. | |
| 11,018,091 | B2 | 5/2021 | Chen et al. | |
| 2019/0393189 | A1* | 12/2019 | Yu | H01L 23/481 |
| 2020/0111681 | A1* | 4/2020 | Suk | H01L 24/16 |
| 2021/0183785 | A1* | 6/2021 | Kwon | H01L 23/49816 |
| 2021/0242083 | A1 | 8/2021 | Hsieh et al. | |
| 2022/0223548 | A1* | 7/2022 | Yang | H01L 24/14 |

FOREIGN PATENT DOCUMENTS

| | | |
|---|---|---|
| KR | 1962508 A | 9/2016 |
| KR | 20220103008 A | 7/2022 |

* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application Nos. 10-2022-0143559 and 10-2022-0155988, filed on Nov. 1, 2022 and filed on Nov. 21, 2022, respectively, in the Korean Intellectual Property Office (KIPO), the contents of which are herein incorporated by reference in their entirety.

BACKGROUND

1. Field

Exemplary embodiments relate to a semiconductor package and a method of manufacturing the semiconductor package. More particularly, exemplary embodiments relate to a fan out package and a method of manufacturing the same.

2. Description of the Related Art

In manufacturing a fan out package, after forming a backside redistribution wiring layer, bonding pads for bonding to solder bumps may be formed on uppermost redistribution wirings by a plating process, and then a protective layer may be formed to expose portions of the bonding pads.—In this case, a contact area between the uppermost redistribution wiring including copper (Cu) and the protective layer may become relatively small and a contact area between the bonding pad that includes gold (Au) and the protective layer may become relatively large. Due to a relatively low adhesive force between a plating pad of the bonding pad and the protective layer, a vertical crack may occur between them during a temperature cycle (TC).

SUMMARY OF THE INVENTION

Exemplary embodiments provide a semiconductor package having with improved reliability.

Exemplary embodiments provide a method of manufacturing the semiconductor package.

According to exemplary embodiments, a semiconductor package includes a core substrate having a cavity, a semiconductor chip disposed in the cavity of the core substrate and having chip pads provided on a front surface of the semiconductor chip, a lower redistribution wiring layer covering a first surface of the core substrate, the lower redistribution wiring layer having first redistribution wirings electrically connected to the chip pads, a sealing layer covering a second surface of the core substrate opposite the first surface, the sealing layer filling the cavity, at least one upper insulating layer provided on the sealing layer, the at least one upper insulating layer having second redistribution wirings electrically connected to conductive structures of the core substrate, a protective layer provided on the at least one upper insulating layer, the protective layer having an opening that exposes at least a portion of an uppermost redistribution wiring among the second redistribution wirings, and a bonding pad provided on the protective layer and electrically connected to the uppermost redistribution wiring through the opening of the protective layer. The bonding pad includes a first plating pattern formed on the uppermost redistribution wiring, the first plating pattern including a via pattern provided in the opening and a pad pattern formed on the via pattern to be exposed from the opening, a second plating pattern formed on the second plating pattern, and a third plating pattern formed on the second plating pattern.

According to exemplary embodiments, a semiconductor package includes at least one semiconductor chip, a frame surrounding the at least one semiconductor chip and having conductive connectors, a lower redistribution wiring layer arranged on a lower surface of the frame and having first redistribution wirings electrically connected to chip pads of the at least one semiconductor chip and the conductive connectors, and an upper redistribution wiring layer arranged on an upper surface of the frame, the upper redistribution wiring layer including at least one upper insulating layer on the frame having second redistribution wirings electrically connected to the conductive connectors of the frame, a protective layer provided on the at least one upper insulating layer and having an opening that exposes at least a portion of an uppermost redistribution wiring among the second redistribution wirings, and a bonding pad provided on the protective layer and electrically connected to the uppermost redistribution wiring through the opening of the protective layer. The bonding pad includes a first pad portion provided in the opening of the protective layer and a second pad portion exposed from the opening on the first pad portion.

According to exemplary embodiments, a semiconductor package includes a lower redistribution wiring layer including first redistribution wirings, a semiconductor chip disposed on the lower redistribution wiring layer and electrically connected to the first redistribution wirings, a support member surrounding the semiconductor chip on the lower redistribution wiring layer, and an upper redistribution wiring layer disposed on the support member, the upper redistribution wiring layer including a sealing layer covering the semiconductor chip, at least one upper insulating layer on the sealing layer having second redistribution wirings electrically connected to conductive structures of the support member, a protective layer provided on the at least one upper insulating layer and having an opening that exposes at least a portion of an uppermost redistribution wiring among the second redistribution wirings, and a bonding pad provided on the protective layer and electrically connected to the uppermost redistribution wiring through the opening of the protective layer. The bonding pad includes a first plating pattern formed on the uppermost redistribution wiring, the first plating pattern including a via pattern provided in the opening and a pad pattern formed on the via pattern to be exposed from the opening, a second plating pattern formed on the second plating pattern, and a third plating pattern formed on the second plating pattern.

According to exemplary embodiments, in a method of manufacturing a semiconductor package, a core substrate having a cavity is provided. At least one semiconductor chip is disposed in the cavity of the core substrate, the at least one semiconductor chip having chip pads provided on a front surface of the at least one semiconductor chip. A sealing layer is formed on a first surface of the core substrate to cover the at least one semiconductor chip. A lower redistribution wiring layer is formed on a second surface of the core substrate opposite to the first surface, the lower redistribution wiring layer having first redistribution wirings electrically connected to the chip pads. At least one upper insulating layer is formed on the sealing layer, the at least on upper insulating layer having second redistribution wirings electrically connected to conductive structures of the core substrate. A protective layer is formed on the at least one upper insulating layer, the protective layer having an opening that exposes at least a portion of an uppermost redistribution wiring among the second redistribution wirings. A bonding pad is formed on the uppermost redistribution wiring, the bonding pad including a first pad portion provided in the opening of the protective layer and a second pad portion exposed from the opening on the first pad portion.

According to exemplary embodiments, an upper redistribution wiring layer of a semiconductor package may include a sealing layer covering an upper surface of a core substrate and a semiconductor chip, at least one upper insulating layer on the sealing layer and having second redistribution wirings electrically connected to conductive structures of the core substrate, a protective layer provided on the upper insulating layer and having an opening that exposes at least a portion of am uppermost redistribution wiring of the second redistribution wirings, and a bonding pad formed on the uppermost redistribution wiring, at least a portion of which is exposed from the opening.

The bonding pad may include a first plating pattern, a second plating pattern and a third plating pattern sequentially stacked on the uppermost redistribution wiring. The first plating pattern may include a via pattern filling the opening of the protective layer and a pad pattern on the via pattern to be exposed from the opening.

Accordingly, a contact area between the first plating pattern including copper (Cu) and the protective layer may become relatively large, and a contact area between the third plating pattern including gold (Au) and the protective layer may become relatively small. Thus, a relatively high adhesive strength between the bonding pad and the protective layer may prevent cracks from occurring during a temperature cycle (TC), to thereby improve TC reliability.

BRIEF DESCRIPTION OF THE DRAWINGS

Exemplary embodiments will be more clearly understood from the following detailed description taken in conjunction with the accompanying drawings.

FIG. 1 is a cross-sectional view illustrating a semiconductor package in accordance with exemplary embodiments.

FIG. 2 is an enlarged cross-sectional view illustrating portion 'A' in FIG. 1.

FIG. 3 is an enlarged cross-sectional view illustrating portion 'A' in FIG. 1 according to a comparative example.

FIGS. 4 to 20 are views illustrating a method of manufacturing a semiconductor package in accordance with exemplary embodiments.

FIG. 21 is a cross-sectional view illustrating a semiconductor package in accordance with exemplary embodiments.

FIG. 22 is an enlarged cross-sectional view illustrating portion 'C' in FIG. 21.

FIGS. 23 to 28 are cross-sectional views illustrating a method of manufacturing a semiconductor package in accordance with exemplary embodiments.

FIG. 29 is a cross-sectional view illustrating a semiconductor package in accordance with exemplary embodiments.

FIG. 30 is an enlarged cross-sectional view illustrating portion 'E' of the semiconductor package of FIG. 29.

FIG. 31 is a cross-sectional view illustrating a semiconductor package in accordance with exemplary embodiments.

FIG. 32 is an enlarged cross-sectional view illustrating portion 'F' in FIG. 31.

FIGS. 33 to 37 are cross-sectional views illustrating a method of manufacturing a semiconductor package in accordance with exemplary embodiments.

DETAILED DESCRIPTION OF THE PREFERRED EMBODIMENTS

Hereinafter, exemplary embodiments will be explained in detail with reference to the accompanying drawings.

Figure 1:
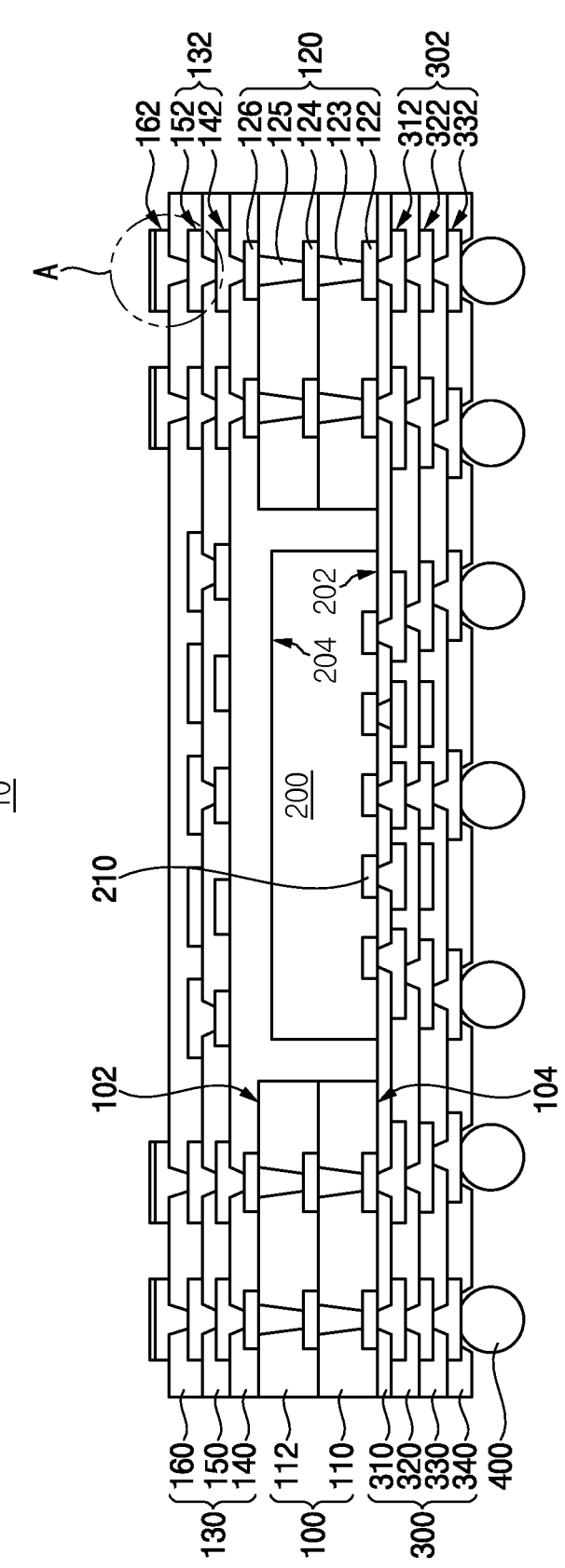
FIGS. 1 to 37 represent non-limiting, exemplary embodiments as described herein.
Figure 2:
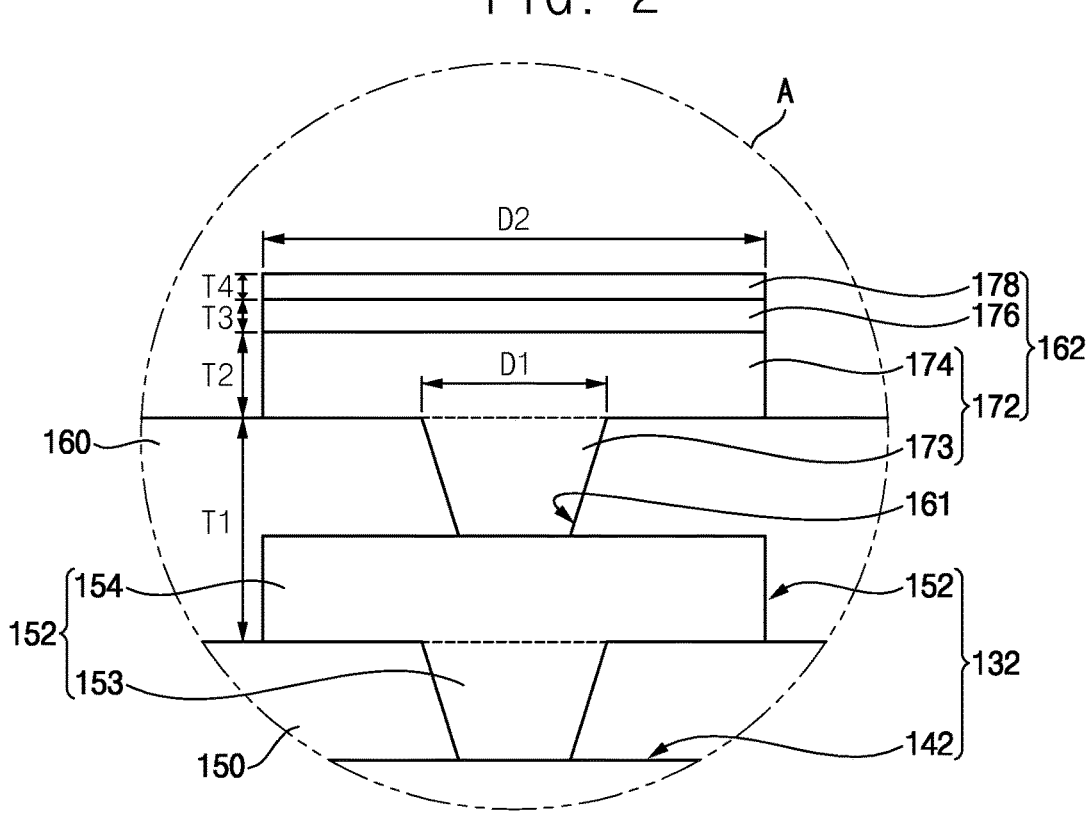

FIG. 1 is a cross-sectional view illustrating a semiconductor package in accordance with exemplary embodiments. FIG. 2 is an enlarged cross-sectional view illustrating portion 'A' in FIG. 1.

Referring to FIGS. 1 and 2, a semiconductor package 10 may include a core substrate 100, at least one semiconductor chip 200 disposed in the core substrate 100, a lower redistribution wiring layer 300 disposed on a lower surface 104 of the core substrate 100, and an upper redistribution wiring layer 130 disposed on an upper surface 102 of the core substrate 100. In addition, the semiconductor package 10 may further include external connection members 400 disposed on an outer surface of the lower redistribution wiring layer 300.

In exemplary embodiments, the semiconductor package 10 may include the core substrate 100 serving as a base substrate surrounding the semiconductor chip 200. The core substrate 100 may serve as a frame surrounding the semiconductor chip 200. The core substrate 100 may serve as a support member supporting the semiconductor chip 200. The core substrate 100 may include core connection wirings 120 as conductive connection structures serving as electrical connection paths with the semiconductor chip 200 in a fan out region outside an area where the semiconductor chip 200 is disposed. Accordingly, the semiconductor package 10 may be provided as a fan out package. Additionally, the semiconductor package 10 may be provided as a unit package on which a second package is stacked.

Additionally, the semiconductor package 10 may be provided as a System In Package (SIP). For example, one or more semiconductor chips may be disposed in the core substrate 100. The semiconductor chips may include a logic chip including a logic circuit and/or a memory chip. The logic chip may be a controller that controls memory chips. The memory chip includes various types of memory circuits such as DRAM, SRAM, flash, PRAM, ReRAM, FeRAM, or MRAM.

In exemplary embodiments, the core substrate 100 may have a first surface (upper surface) 102 and a second surface (lower surface) 104 opposite to each other. The core substrate 100 may have a cavity 106 in a central region thereof. The cavity 106 may extend from the first surface 102 to the second surface 104 of the core substrate 100.

The core substrate 100 may include a plurality of stacked insulating layers 110 and 120 and the core connection wirings 120 in the insulating layers. The plurality of core connection wirings 120 may be provided in the fan out region outside the area where the semiconductor chip (die) is disposed and may be used for electrical connection with the mounted semiconductor chip. The core connection wiring 120 may be a vertical connection structure penetrating the core substrate 100 from the first surface 102 to the second surface 104 of the core substrate 100.

For example, the core substrate 100 may include a first insulating layer 110 and a second insulating layer 112 stacked on the first insulating layer 110. The core connection wiring 120 may include a first wiring 122, a first contact 123, a second wiring 124, a second contact 125 and a third wiring 126. The first wiring 122 may be provided on the second surface 104 of the core substrate 100, that is, a lower surface of the first insulating layer 110, and at least a portion of the first wiring 122 may be exposed from the second surface 104. The third wiring 126 may be provided on the first surface 102 of the core substrate 100, that is, an upper surface of the second insulating layer 112, and at least a portion of the third wiring 126 may be exposed from the first surface 102. The numbers and arrangements of the insulating layers and the core connection wirings of the core substrate 100 are provided as examples, and it will be understood that the present invention is not limited thereto.

In exemplary embodiments, the semiconductor chip 200 may be disposed in the cavity 106 of the core substrate 110. A sidewall of the semiconductor chip 200 may be spaced apart from an inner wall of the cavity 106. Accordingly, a gap may be formed between the sidewall of the semiconductor chip 200 and the inner wall of the cavity 106.

The semiconductor chip 200 may include a substrate and chip pads 210 on a front surface 202 of the substrate, that is, an active surface. The front surface 202 of the semiconductor chip 200 on which the chip pads 210 are formed may face downward. Accordingly, the chip pads 210 may be exposed from the second surface 104 of the core substrate 100. The front surface 202 of the semiconductor chip 200 may be positioned on the same plane as the second surface 104 of the core substrate 100. A backside surface 204 opposite to the front surface 202 of the semiconductor chip 200 may be positioned lower than the first surface 102 of the core substrate 100. A thickness of the semiconductor chip 200 may be smaller or larger than a thickness of the core substrate 100. The thickness of the semiconductor chip 200 may be within a range of 60 μm to 150 μm, and the thickness of the core substrate 100 may be within a range of 50 μm to 140 μm.

In exemplary embodiments, a sealing layer 140 may be provided on the first surface 102 of the core substrate 100 to cover the backside surface 204 of the semiconductor chip 200 while filling the cavity 106. The sealing layer 140 may have openings that expose the third wirings 126 of the core connection wirings 120.

The sealing layer 140 may be formed to fill the gap between the sidewall of the semiconductor chip 200 and the inner wall of the cavity 106. Accordingly, the sidewall and the backside surface of the semiconductor chip 200, the first surface 102 of the core substrate 100 and the inner wall of the cavity 106 may be covered by the sealing layer 140.

For example, the sealing layer 140 may include a resin containing a reinforcing material such as inorganic fillers, a thermosetting resin such as an epoxy resin, a thermoplastic resin such as polyimide, etc. Specifically, the sealing layer may include an insulating film such as Ajinomoto Build-up Film (ABF), a photosensitive insulating material such as photo imagable dielectric (PID), a composite material such as FR-4, a resin such as Bismaleimide Triazine (BT), etc.

In exemplary embodiments, the lower redistribution wiring layer 300 may be disposed on the front surface 202 of the semiconductor chip 200 and the second surface 104 of the core substrate 100, and may have first redistribution wirings 302 electrically connected to the chip pads 210 of the semiconductor chip 200 and the core connection wirings 120 respectively. The first redistribution wirings 302 may be provided on the front surface 202 of the semiconductor chip 200 and the second surface 104 of the core substrate 100 to serve as front redistribution wirings. Accordingly, the lower redistribution wiring layer 300 may be a front redistribution wiring layer (FRDL) of the fan out package.

In particular, the lower redistribution wiring layer 300 may include a first lower redistribution wiring layer having first lower redistribution wirings 312 disposed on a first lower insulating layer 310.

The first lower insulating layer 310 may be provided on the second surface 104 of the core substrate 100 and may have openings that expose the chip pads 210 of the semiconductor chip 200 and the first wirings 122 of the core connection wirings 120. The first lower redistribution wirings 312 may be formed on the first lower insulating layer 310 and at least portions of the first lower redistribution wirings 312 may directly contact the chip pads 210 and the first wirings 122 through the openings of the first lower insulating layer 310.

The lower redistribution wiring layer 300 may include a second lower redistribution wiring layer having second lower redistribution wirings 322 disposed on a second lower insulating layer 320.

The second lower insulating layer 320 may be provided on the first lower insulating layer 310 and may have openings that expose the first lower redistribution wirings 312. The second lower redistribution wirings 322 may be formed on the second lower insulating layer 320 and at least portions of the second lower redistribution wirings 322 may directly contact the first lower redistribution wirings 312 through the openings of the second lower insulating layer 320.

The lower redistribution wiring layer 300 may include a third lower redistribution wiring layer including third lower redistribution wiring layers 322 disposed on a third lower insulating layer 330.

The third lower insulating layer 330 may be provided on the second lower insulating layer 320 and may have openings that expose the second lower redistribution wirings 322. The third lower redistribution wirings 332 may be formed on the third lower insulating layer 330 and at least portions of the third lower redistribution wirings 332 may directly contact the second lower redistribution wirings 322 through the openings of the third lower insulating layer 330.

The lower redistribution wiring layer 300 may include a fourth lower insulating layer 340 provided on the third lower insulating layer 330 to expose portions of the third lower redistribution wirings 332. The fourth lower insulating layer 340 may serve as a passivation layer. A bump pad (not illustrated) such as an under bump metal (UBM) may be provided on the third lower redistribution wiring 332 exposed by the fourth lower insulating layer 340. In this case, the bump pad on the third lower redistribution wiring 332 exposed by the fourth lower insulating layer 340 may serve as a landing pad, that is, a package pad.

As an example, the first, second, third and fourth lower insulating layers may include a polymer or a dielectric layer. The first, second and third lower insulating layers may include a photosensitive insulating material such as PID, and the fourth lower insulating layer may include an insulating film such as ABF. The first, second and third lower redistribution wirings may include copper (Cu), aluminum (Al), tin (Sn), nickel (Ni), gold (Au), platinum (Pt), or any alloy thereof. A thickness of each of the first, second and third lower redistribution wirings may be within a range of 3 μm to 8 μm.

Accordingly, the lower redistribution wiring layer 300 may be provided on the front surface 202 of the semiconductor chip 200 and the second surface 104 of the core substrate 100 and may have the first redistribution wirings 302 electrically connected to the chip pads 210 and the core connection wirings 120 respectively. The lower redistribution wiring layer 300 may cover the second surface 104 of the core substrate 100 provided in an outer region (fan out region) of the semiconductor chip 200. Some of the first redistribution wirings 302 may electrically connect the semiconductor chip 200 and the core connection wirings 120 of the core substrate 100. The numbers, arrangements, etc. of the lower insulating layers and the lower redistribution wirings of the lower redistribution wiring layer are provided as examples, and it will be understood that the present invention is not limited thereto.

In exemplary embodiments, the upper redistribution wiring layer 130 may include the sealing layer 140 on the backside surface 204 of the semiconductor chip 200 and the first surface 102 of the core substrate 100, at least one upper insulating layer 150 on the sealing layer 140 having second redistribution wirings 132 electrically connected to the core connection wirings 120, a protective layer 160 on the at least one upper insulating layer 150 having an opening 161 that exposes at least a portion of an uppermost redistribution wiring 152 among the second redistribution wirings 132, and a bonding pad 162 provided on the protective layer 160 and electrically connected to the uppermost redistribution wiring 152 through the opening 161. The second redistribution wirings 132 may be provided on the backside surface 204 of the semiconductor chip 200 and the first surface 102 of the core substrate 100 to serve as backside redistribution wirings. Accordingly, the upper redistribution wiring layer 130 may be a backside redistribution wiring layer (BRDL) of the fan out package.

In particular, the upper redistribution wiring layer 130 may include a first upper redistribution wiring layer including the sealing layer 140 and first upper redistribution wirings 142 disposed on the sealing layer 140.

The sealing layer 140 may be provided on the first surface 102 of the core substrate 100 and may have openings that expose the third wirings 126 of the core connection wirings 120. The first upper redistribution wirings 142 may be formed on the sealing layer 140 and at least portions of the first upper redistribution wirings 142 may directly contact the third wirings 126 through the openings of the sealing layer 140.

The upper redistribution wiring layer 130 may include a second upper redistribution wiring layer including the upper insulating layer 150 and second upper redistribution wirings 152 disposed on the upper insulating layer 150.

The upper insulating layer 150 may be provided on the sealing layer 140 and may have openings that expose the first upper redistribution wirings 142. The second upper redistribution wirings 152 may be formed on the upper insulating layer 150 and at least portions of the second upper redistribution wirings 152 may directly contact the first upper redistribution wirings 142 through the openings of the upper insulating layer 150.

For example, the second redistribution wirings 132 may include copper (Cu), aluminum (Al), tin (Sn), nickel (Ni), gold (Au), platinum (Pt), or any alloy thereof. The upper insulating layer 150 may include an insulating film such as ABF, which is the same as the sealing layer 140.

The upper redistribution wiring layer 130 may include the first upper redistribution wiring 142 and the second upper redistribution wiring 152 stacked in at least two layers. In this case, the second upper redistribution wiring 152 may correspond to the uppermost redistribution wiring of the second redistribution wirings 132. The bonding pad 162 may be provided on the second upper redistribution wiring 152.

In one exemplary embodiment, the upper redistribution wiring layer 130 may include a third upper redistribution wiring layer including a second upper insulating layer and third upper redistribution wirings disposed on the second upper insulating layer. In this case, the upper redistribution wiring layer 130 may include the first upper redistribution wiring 142, the second upper redistribution wiring 152 and the third upper redistribution wiring stacked in three layers. In this case, the third upper redistribution wiring may correspond to the uppermost redistribution wiring among the second redistribution wirings. In this case, the bonding pad may be formed on the third upper redistribution wiring.

As illustrated in FIG. 2, in exemplary embodiments, the protective layer 160 may be provided on the upper insulating layer 150 and may have the opening 161 that exposes at least a portion of the uppermost redistribution wiring 152 among the second redistribution wirings 132.

The protective layer 160 may include an insulating film such as ABF. The protective layer 160 may include the same material as or a different material from the upper insulating layer 150. A thickness T1 of the protective layer 160 may be within a range of 10 $\mu$m to 20 $\mu$m. A diameter D1 of the opening 161 of the protective layer 160 may be within a range of 50 $\mu$m to 250 $\mu$m.

The second upper redistribution wiring 152 may include a redistribution via 153, a redistribution line (not illustrated) and a redistribution pad 154. The redistribution via 153 may be formed to penetrate the upper insulating layer 150. The redistribution line may be formed to extend from the redistribution pad 154 on the upper insulating layer 150. The redistribution pad 154 may be formed on the redistribution via 153 and may be formed at one end of the redistribution line. For example, a diameter of the redistribution pad 154 may be within a range of 300 $\mu$m to 350 $\mu$m. A thickness of the redistribution pad 154 may be within a range of 5 $\mu$m to 15 $\mu$m.

The bonding pad 162 may include a first pad portion provided in the opening 161 of the protective layer 160 and a second pad portion exposed from the opening 161 on the first pad portion. The bonding pad 162 may include a first plating pattern 172, a second plating pattern 176 and a third plating pattern 178 sequentially stacked on the second upper redistribution wiring 152.

In particular, the first plating pattern 172 may include a via pattern 173 filling the opening 161 of the protective layer 160 and a pad pattern 174 exposed from the opening 161 on the via pattern 173. The first plating pattern 172 may include the same material as the second upper redistribution wiring 152. For example, the first plating pattern 172 may include copper (Cu).

A diameter D2 of the pad pattern 174 may be greater than a diameter D1 of the via pattern 173. The diameter D2 of the pad pattern 174 may be within a range of 100 $\mu$m to 300 $\mu$m. The diameter D1 of the via pattern 173 may be within a range of 50 $\mu$m to 250 $\mu$m. A thickness T2 of the pad pattern 174 may be within a range of 5 $\mu$m to 15 $\mu$m.

The second plating pattern 176 may be formed on the first plating pattern 172. The second plating pattern 176 may include a material serving as an anti-diffusion layer between a solder alloy soldered on the bonding pad 162 and the first plating pattern 172. For example, the second plating pattern 176 may include nickel (Ni).

A thickness T3 of the second plating pattern 176 may be smaller than the thickness T2 of the pad pattern 174. The thickness T3 of the second plating pattern 176 may be within a range of 2 $\mu$m to 8 $\mu$m. A diameter of the second plating pattern 176 may be the same as the diameter D2 of the via pattern 174.

The third plating pattern 178 may be formed on the second plating pattern 176. The third plating pattern 178 may include a material for wetting with the solder alloy material. For example, the third plating pattern 178 may include gold (Au).

A thickness T4 of the third plating pattern 178 may be smaller than the thickness T3 of the second plating pattern 176. The thickness T4 of the third plating pattern 178 may be within a range of 0.2 μm to 1 μm.

The protective layer 160 may serve as a passivation layer. For example, the protective film 160 may include an insulating film such as ABF that is the same as the sealing layer 140 and the upper insulating film 150. A portion of the bonding pad 162 may be formed within the opening 161 of the protective layer 160 and the remaining portion of the bonding pad 162 may be exposed through the opening 161. That is, the bonding pad 162 may have a Non-Solder Mask Defined (NSMD) type pad structure.

In exemplary embodiments, external connection members 400 may be disposed on the package pads on the outer surface of the lower redistribution wiring layer 300. For example, the external connection member 400 may include a solder ball. The solder ball may have a diameter of 300 μm to 500 μm. The semiconductor package 10 may be mounted on a module substrate (not illustrated) via the solder balls to form a memory module.

As described above, the semiconductor package 10 as a fan out panel level package may include the upper redistribution wiring layer 130 covering the upper surface 102 of the core substrate 100 and including the sealing layer 140 covering the semiconductor chip 200, the at least one upper insulating layer 150 on the sealing layer 140 having the second redistribution wirings 132 electrically connected to the conductive structures 120 of the core substrate 100, the protective layer 160 provided on the upper insulating layer 150 and having the opening 161 that exposes the at least a portion of the uppermost redistribution wiring 152 of the second redistribution wirings 132, and the bonding pads 162 formed on the uppermost redistribution wiring 152, at least a portion of which is exposed from the opening 161.

The bonding pad 162 may include the first plating pattern 172, the second plating pattern 176 and the third plating pattern 178 sequentially stacked on the second upper redistribution wiring 152. The first plating pattern 172 may include the via pattern 173 filling the opening 161 of the protective layer 160 and the pad pattern 174 exposed from the opening 161 on the via pattern 173.

Accordingly, a contact area between the first plating pattern 172 including copper (Cu) and the protective layer 160 may become relatively large, and a contact area between the third plating pattern 178 including gold (Au) and the protective layer 160 may become relatively small. Thus, a relatively high adhesive strength between the bonding pad and the protective layer may prevent cracks from occurring during a temperature cycle (TC), to thereby improve TC reliability.

Further, since the entire upper surface of the bonding pad 162 is exposed, a bonding area with a solder bump soldered on the bonding pad may be increased to thereby improve a mountability of the upper package.

Figure 3:
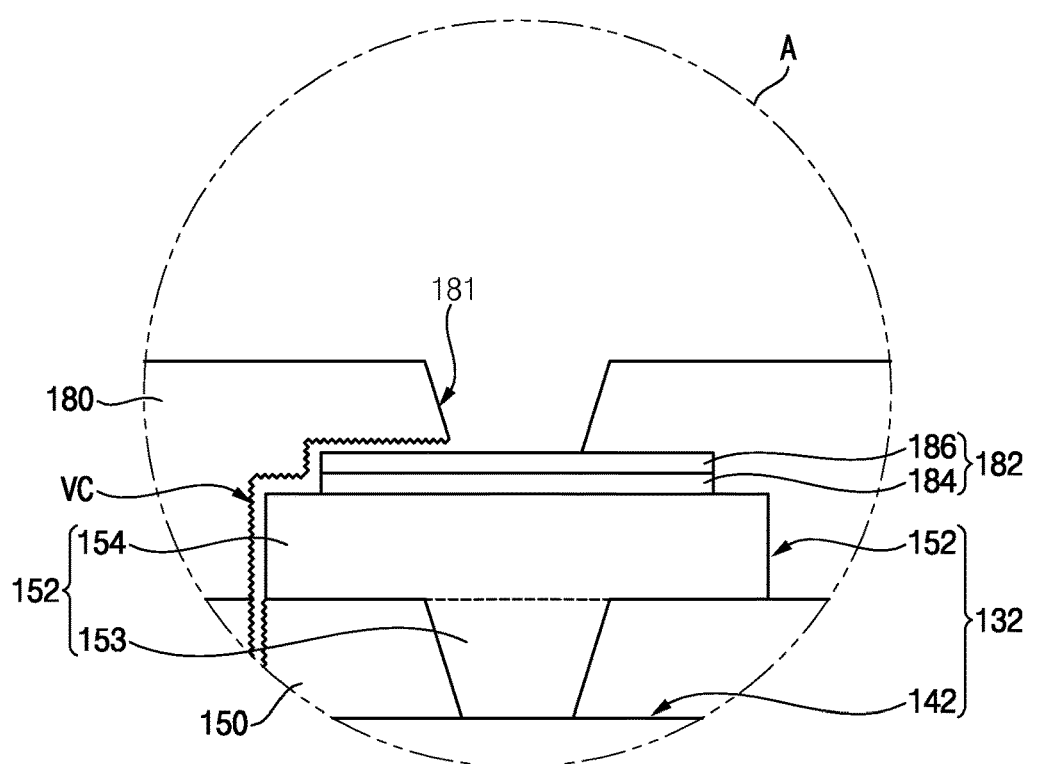

FIG. 3 is an enlarged cross-sectional view illustrating portion 'A' in FIG. 1 according to a comparative example.

Referring to FIG. 3, an upper redistribution wiring layer according to a comparative example may include at least one upper insulating layer 150 having second redistribution wirings 132, a bonding pad 182 disposed on an uppermost redistribution wiring 152 among the second redistribution wirings 132, and a passivation layer 180 provided on the upper insulating layer 150 and having an opening 181 that exposes at least a portion of the bonding pad 182. The bonding pad 182 may include a first plating pattern 184 and a second plating pattern 186 sequentially formed on the uppermost redistribution wiring 152. For example, the first plating pattern 184 may include nickel (Ni), and the second plating pattern 186 may include gold (Au).

A peripheral portion of the bonding pad 182 may be covered by the passivation layer 180, and a middle portion of the bonding pad 182 may be exposed through the opening 181 of the passivation layer 180. The bonding pad 180 may have a solder mask defined (SMD) type pad structure.

Accordingly, a contact area between the uppermost redistribution wiring 150 containing copper (Cu) and the passivation layer may become relatively small, and a contact area between the second plating pattern 186 containing gold (Au) and the passivation layer may become relatively large. Thus, due to a relatively low adhesive force between the second plating pattern and the passivation layer, a vertical crack VC may occur between them during the temperature cycle TC.

Hereinafter, a method of manufacturing the semiconductor package of FIG. 1 will be described.

Figure 4:
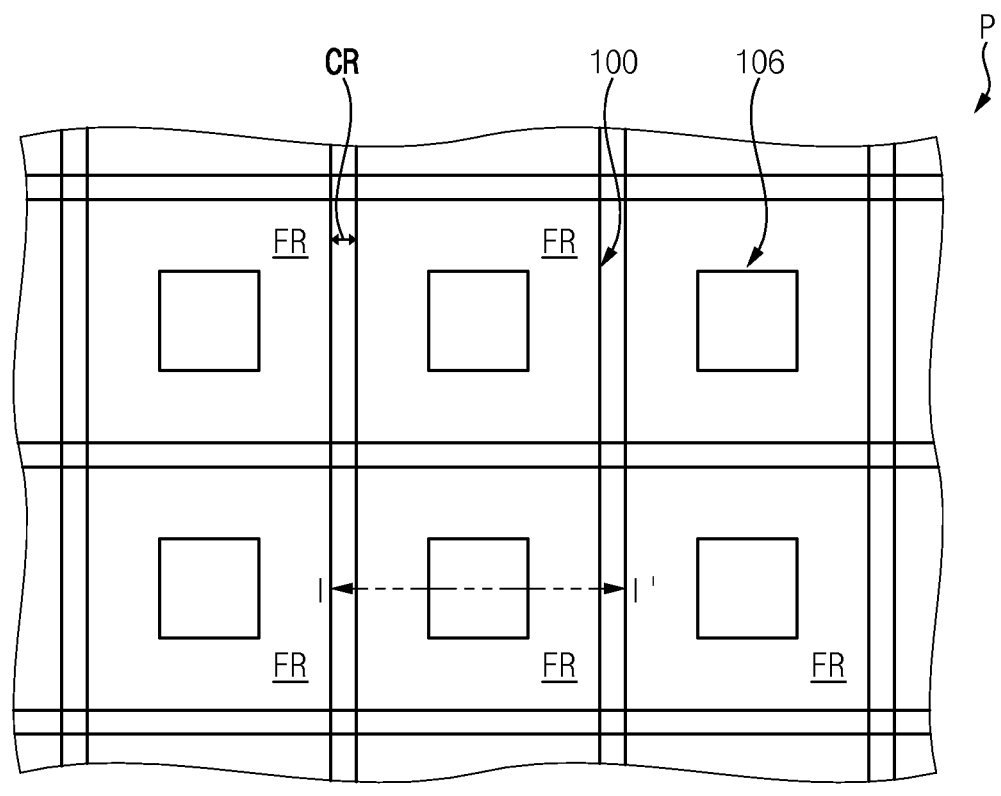
Figure 4:
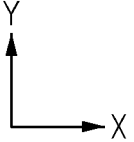

FIGS. 4 to 20 are views illustrating a method of manufacturing a semiconductor package in accordance with exemplary embodiments. FIG. 4 is a plan view illustrating a panel in which a plurality of core substrates is formed. FIGS. 5 to 12, 14, 16, 18 and 20 are cross-sectional views taken along line I-I' in FIG. 4. FIGS. 13, 15, 17 and 19 are enlarged cross-sectional views illustrating portions 'B' in FIGS. 12, 14, 16 and 18 respectively.

Referring to FIGS. 4 to 7, first, a panel P in which a plurality of core substrates 100 is formed may be prepared, a semiconductor chip 200 may be placed in a cavity 106 of the core substrate 100, and a sealing layer 140 may be formed to cover the semiconductor chip 200.

In exemplary embodiments, the core substrate 100 may be used as a base substrate as a support member for electrical connection on which the semiconductor chip 200 is arranged to manufacture a semiconductor package having a fan-out panel level package configuration.

As illustrated in FIG. 4, the panel P may include a frame region FR for the core substrate 100 and a scribe lane region surrounding the frame region FR, that is, a cutting region CR. As will be described later, the panel P may be cut along the cutting region CR dividing the frame region FR to be individualized into the core substrate 100.

Figure 5:
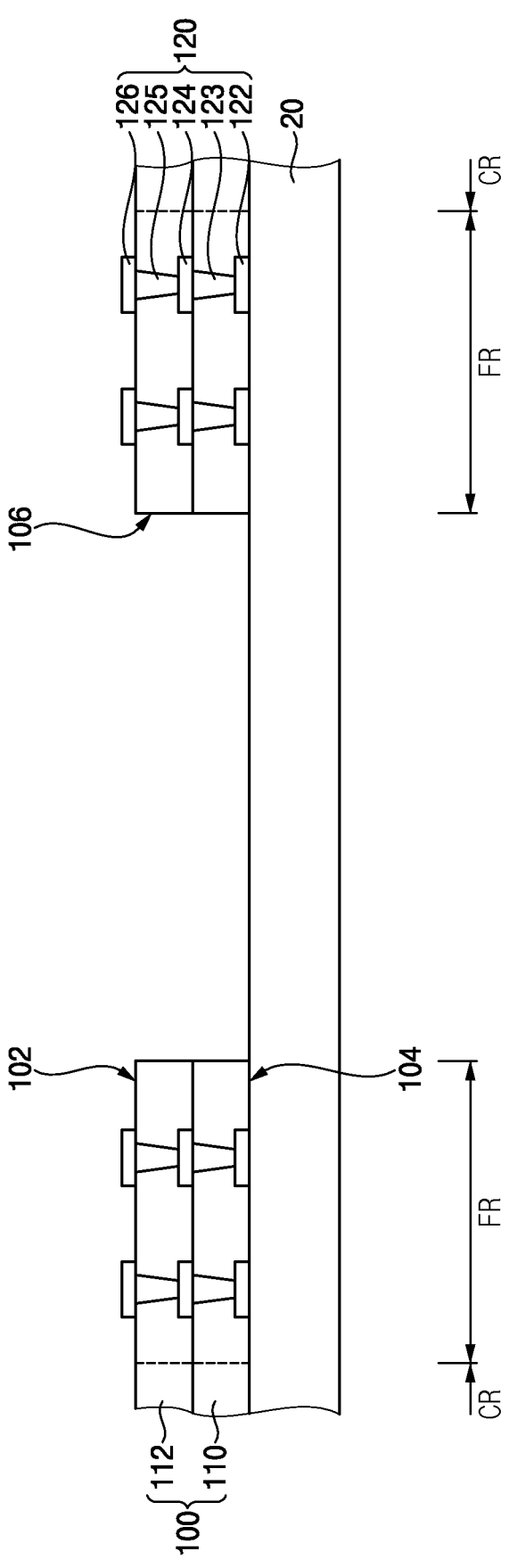

As illustrated in FIG. 5, the core substrate 100 may have a first surface 102 and a second surface 104 opposite to the first surface 102. The core substrate 100 may have a cavity 106 in a central region thereof. As will be described later, the cavity 106 may have a planar area for accommodating at least one semiconductor chip.

The core substrate 100 may include a plurality of stacked insulating layers 110 and 112, and core connection wirings 120 as conductive connection structures provided in the insulating layers. The plurality of core connection wirings 120 may be provided to penetrate the core substrate 100 from the first surface 102 to the second surface 104 of the core substrate 100 to serve as electrical connection passages, respectively. That is, the core connection wirings 120 may be provided in a fan out region outside an area where the semiconductor chip (die) is disposed and may be used for electrical connection. For example, the core connection wiring 120 may include a first wiring 122, a first contact 123, a second wiring 124, a second contact 125 and a third wiring 126. Alternatively, the core connection wiring may include a through via penetrating the core substrate.

Figure 6:
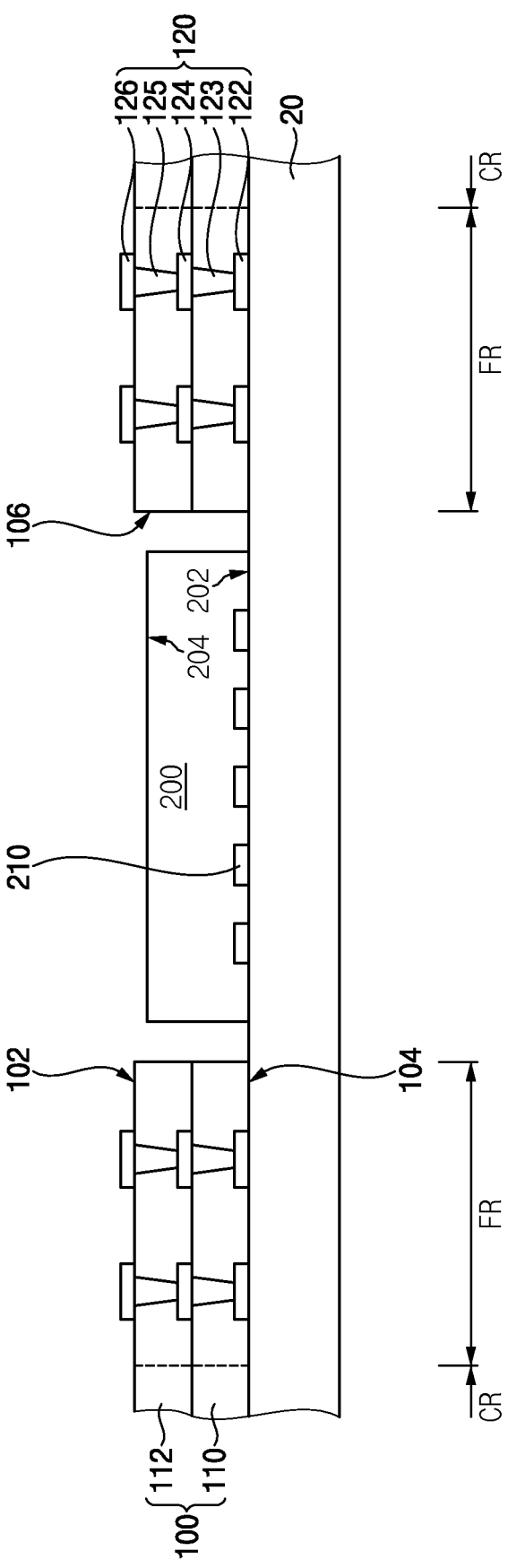

As illustrated in FIGS. 5 and 6, after the panel P is disposed on a barrier tape 20, at least one semiconductor chip 200 may be disposed in the cavity 106.

The second surface 104 of the core substrate 100 may be attached on the barrier tape 20. For example, dies (chips) may be disposed in hundreds to thousands of cavities 106 of the panel P, respectively. As will be described later, individual fan out panel level packages may be completed by cutting the panel P along the cutting region CR by performing a singulation process. Alternatively, a plurality of semiconductor chips 200 may be arranged in one cavity 106.

The semiconductor chip 200 may include a substrate and chip pads 210 provided on a front surface 202 of the substrate, that is, an active surface. The semiconductor chip 200 may be disposed such that the front surface of the semiconductor chip 200 on which the chip pads 210 are formed faces the barrier tape 20. The front surface 202 of the semiconductor chip 200 may be positioned on the same plane as the second surface 104 of the core substrate 100.

The semiconductor chip 200 may be disposed in the cavity 106 of the core substrate 100. A sidewall of the semiconductor chip 200 may be spaced apart from an inner wall of the cavity 106. Thus, a gap may be formed between the sidewall of the semiconductor chip 200 and the inner wall of the cavity 106.

A thickness of the semiconductor chip 200 may be smaller than a thickness of the core substrate 100. Accordingly, a backside surface 204 of the semiconductor chip 200 may be positioned lower than the first surface 102 of the core substrate 100. Alternatively, the thickness of the semiconductor chip 200 may be equal to or greater than the thickness of the core substrate 100. In this case, the backside surface 204 of the semiconductor chip 200 may be positioned on the same plane as or higher than the first surface 102 of the core substrate 100.

Figure 7:
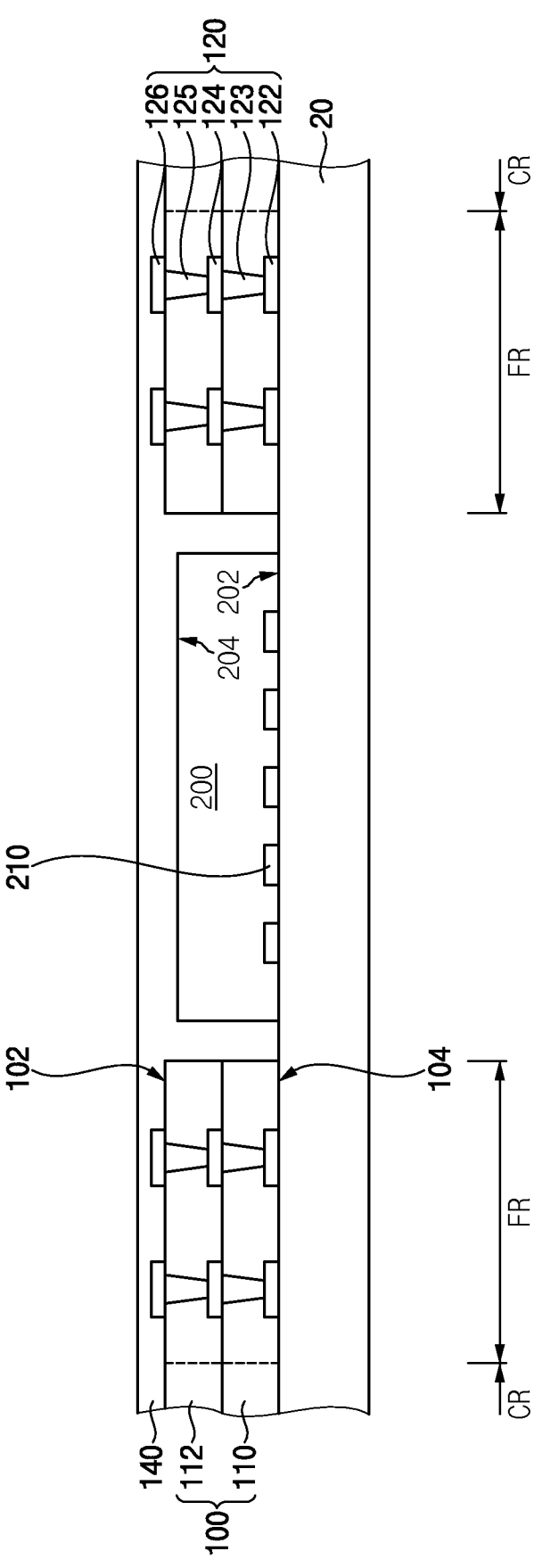

As illustrated in FIG. 7, the sealing layer 140 may be formed on the first surface 102 of the core substrate 100 to cover the semiconductor chip 200. The sealing layer 140 may be formed to fill the gap between the sidewall of the semiconductor chip 200 and the inner wall of the cavity 106. Accordingly, the backside surface 204 of the semiconductor chip 200, the first surface 102 of the core substrate 100 and the inner wall of the cavity 106 may be covered by the sealing layer 140.

For example, the sealing layer 140 may include an insulating film such as ABF (Ajinomoto Build-up Film), an insulating material (thermosetting dielectric material) such as epoxy resin, a photosensitive insulating material such as photo imagable dielectric (PID), etc. When the sealing layer 140 includes the insulating film such as ABF, the sealing layer 140 may be formed by a lamination process.

Figure 8:
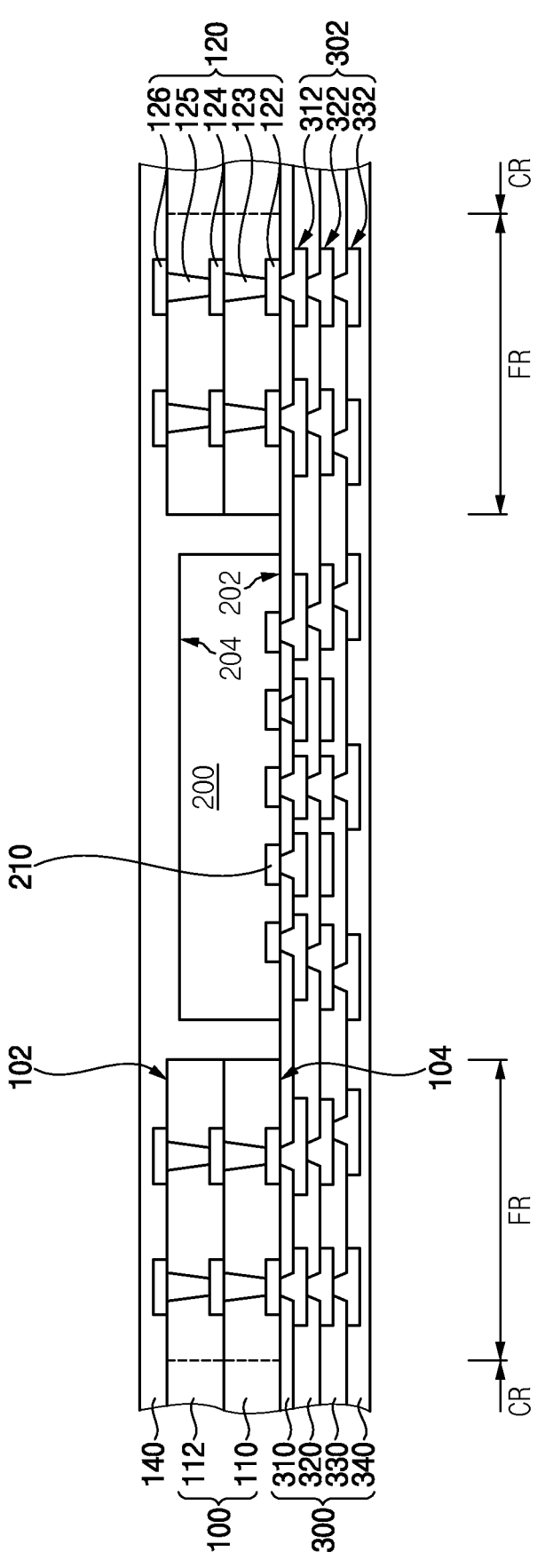

Referring to FIG. 8, a lower redistribution wiring layer 300 as a front redistribution wiring layer may be formed on the second surface 104 of the core substrate 100 and the front surface 202 of the semiconductor chip 200. The lower redistribution wiring layer 300 having first redistribution wirings 302 electrically connected to the chip pads 210 of the semiconductor chip 200 and the core connection wirings 120 respectively may be formed the second surface 104 of the core substrate 100 and the front surface 202 of the semiconductor chip 200. The lower redistribution wiring layer 300 may be a front redistribution wiring layer (FRDL) of the fan out package.

In particular, after removing the barrier tape 20, the structure of FIG. 7 may be turned over, and the sealing layer 140 may be attached onto a first carrier substrate (not illustrated). Then, after a first lower insulating layer 310 is formed to cover the second surface 104 of the core substrate 100 and the front surface 202 of the semiconductor chip 200, the first lower insulating layer 310 may be patterned to form openings that expose the chip pads 210 of the semiconductor chip 200 and the first wirings 122 of the core connection wiring 120.

For example, the first lower insulating layer 310 may include a polymer or a dielectric layer. The first lower insulating layer 310 may include a photosensitive insulating material such as PID or an insulating film such as ABF. The first lower insulating layer may be formed by a spin coating process, a vapor deposition process, etc.

Then, first lower redistribution wirings 312 may be formed on the first lower insulating layer 310. The first lower redistribution wirings 312 may directly contact the chip pads 210 and the first wirings 122 through the openings of the first lower insulating layer 310.

The first lower redistribution wirings may be formed by forming a seed layer in a portion of the first lower insulating layer 310 and in the opening, patterning the seed layer and performing an electroplating process. Accordingly, at least portions of the first lower redistribution wirings 312 may directly contact the chip pad 210 and the first wiring 122 through the openings.

For example, the first lower redistribution wiring may include copper (Cu), aluminum (Al), tin (Sn), nickel (Ni), gold (Au), platinum (Pt), or an alloy thereof . . . .

Similarly, after the second lower insulating layer 320 is formed on the first lower insulating layer 310, the second lower insulating layer 320 may be patterned to form openings that expose the first lower redistribution wrings 312 respectively. Then, second lower redistribution wirings 322 may be formed on the second lower insulating layer 320 to directly contact the first lower redistribution wirings 312 through the openings of the second lower insulating layer 320.

Then, after the third lower insulating layer 330 is formed on the second lower insulating layer 320, the third lower insulating layer 330 may be patterned to form openings that expose the second lower redistribution wirings 322 respectively. Then, the third lower redistribution wirings 332 may be formed on the third lower insulating layer 330 to directly contact the second lower redistribution wirings 322 through the openings of the third lower insulating layer 330. The third lower redistribution wiring 332 may be the uppermost first redistribution wiring among the first redistribution wirings 302. Then, a fourth lower insulating layer 340 may be formed on the third lower insulating layer 330 to cover the third lower redistribution wirings 332.

Although not illustrated in the figures, a bump pad such as under bump metallurgy (UBM) may be formed on the third lower redistribution wiring 332 by a plating process before forming a fourth lower insulating layer 340. As will be described later, portions of the bump pads on the third lower redistribution wirings 332 may be exposed by partially removing the fourth lower insulating layer 340 by following a via forming process. The fourth lower insulating layer 340 may serve as a passivation layer.

The fourth lower insulating layer may include an insulating film such as ABF or a photosensitive insulating material such as PID. The fourth lower insulating layer may include the same material as or a different material from the first to third lower insulating layers.

Figure 9:
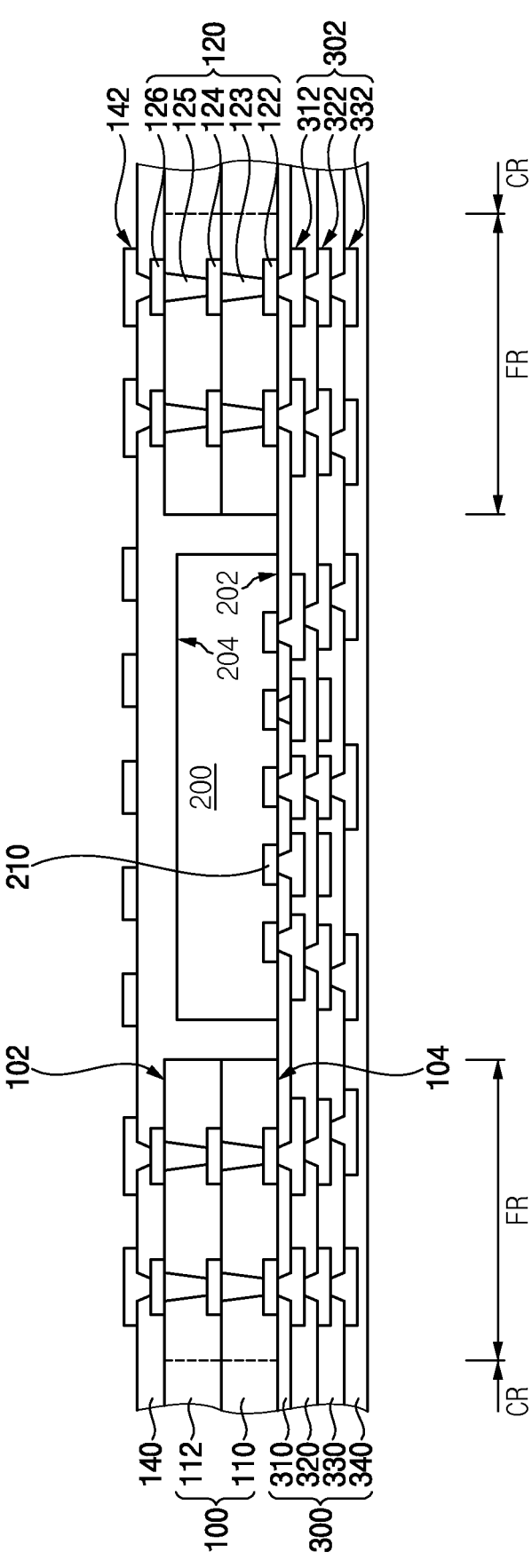
Figure 10:
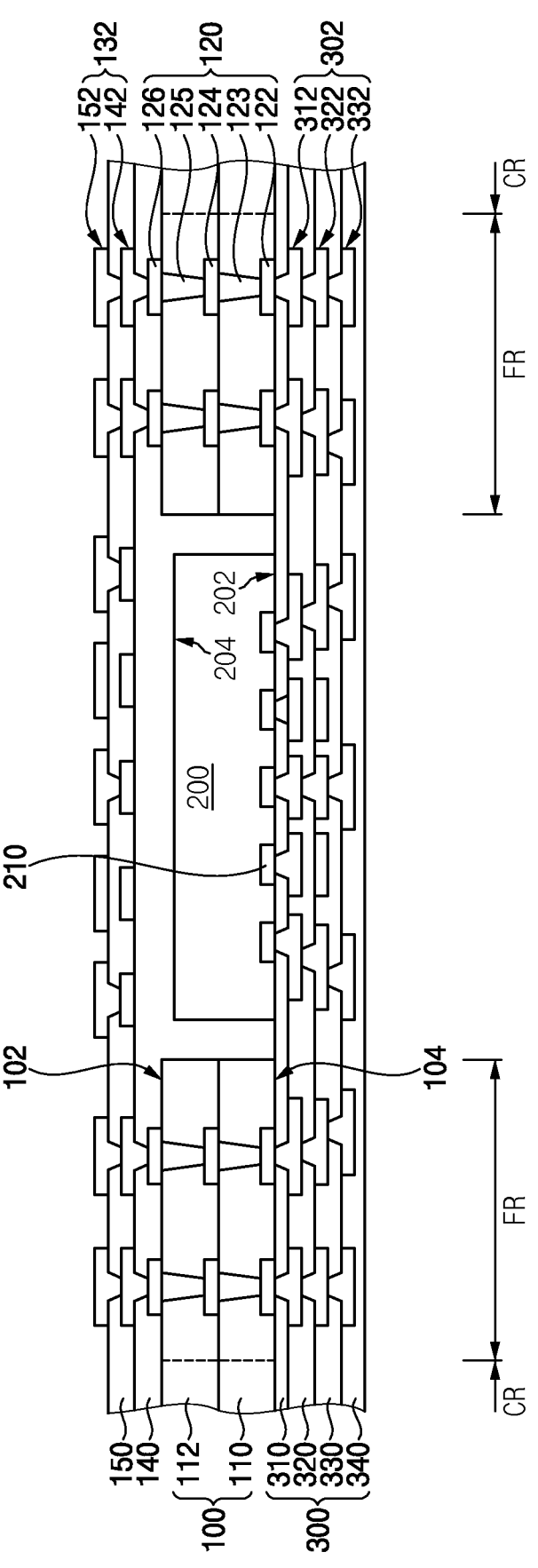

Referring to FIGS. 9 and 10, at least one upper insulating layer as a backside insulating layer 150 having second redistribution wirings 132 may be formed on the sealing layer 140 on the first surface 102 of the core substrate 100 and the backside surface 204 of the semiconductor chip 200.

As illustrated in FIG. 9, after removing the first carrier substrate, the lower redistribution wiring layer 300 may be attached to a second carrier substrate (not illustrated). Then, the sealing layer 140 on the first surface 102 of the core substrate 100 may be partially removed to form openings that expose the third wirings 126 of the core connection wirings 120, and then, first upper redistribution wirings 142 may be formed on the sealing layer 140. The first upper redistribution wirings 142 may be electrically connected to the core connection wirings 120 through the openings of the sealing layer 140.

As illustrated in FIG. 10, after forming the upper insulating layer 150 on the sealing layer 140, the upper insulating layer may be partially removed to form openings that expose the first upper redistribution wirings 142 and second upper redistribution wirings 152 may be formed on the upper insulating layer 150. The upper insulating layer may include an insulating film such as ABF that is the same as the sealing layer 140.

The second redistribution wirings 132 may include the first upper redistribution wiring 142 and the second upper redistribution wiring 152 stacked in at least two layers. In this case, the second upper redistribution wiring 152 may correspond to an uppermost redistribution wiring among the second redistribution wirings. Bonding pads may be formed on the second upper redistribution wirings by a subsequent process. For example, the first and second upper redistribution wirings may include copper (Cu), aluminum (Al), tin (Sn), nickel (Ni), gold (Au), platinum (Pt), or any alloys thereof.

In one exemplary embodiment, after forming a second upper insulating layer on the upper insulating layer, the second upper insulating layer may be partially removed to form openings that expose the second upper redistribution wirings 152, and third upper redistribution wirings may be formed on the second upper insulating layer. In this case, the second redistribution wirings 132 may include the first upper redistribution wiring 142, the second upper redistribution wiring 152 and the third upper redistribution wiring stacked in three layers. The third upper redistribution wiring may correspond to the uppermost redistribution wiring among the second redistribution wirings.

Referring to FIGS. 11 to 19, bonding pads 162 may be formed on the second upper redistribution wirings 152 which are the uppermost redistribution wirings.

Figure 11:
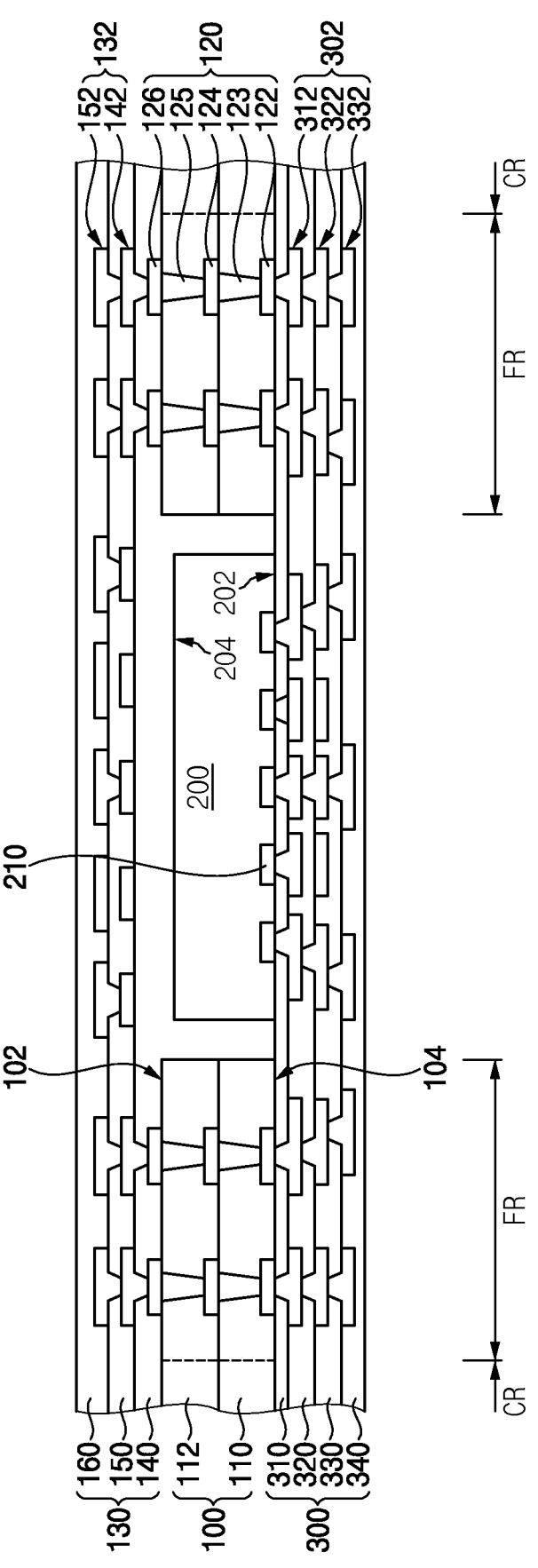
Figure 12:
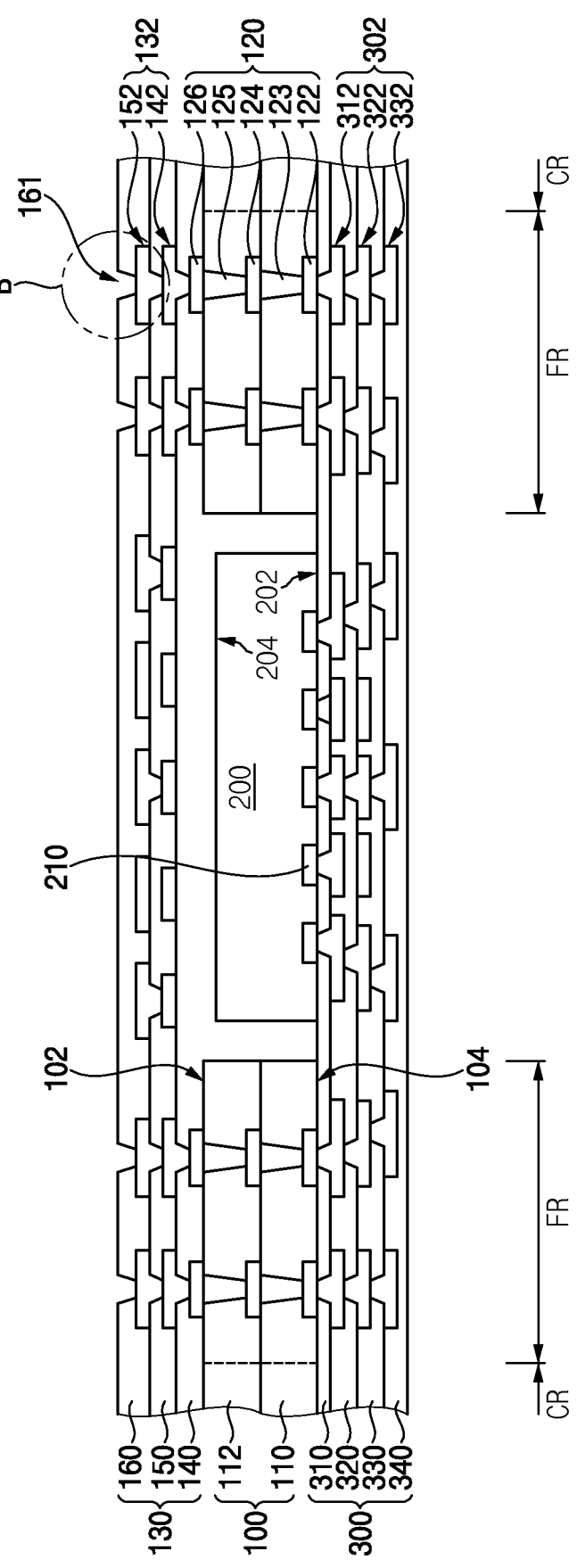
Figure 13:
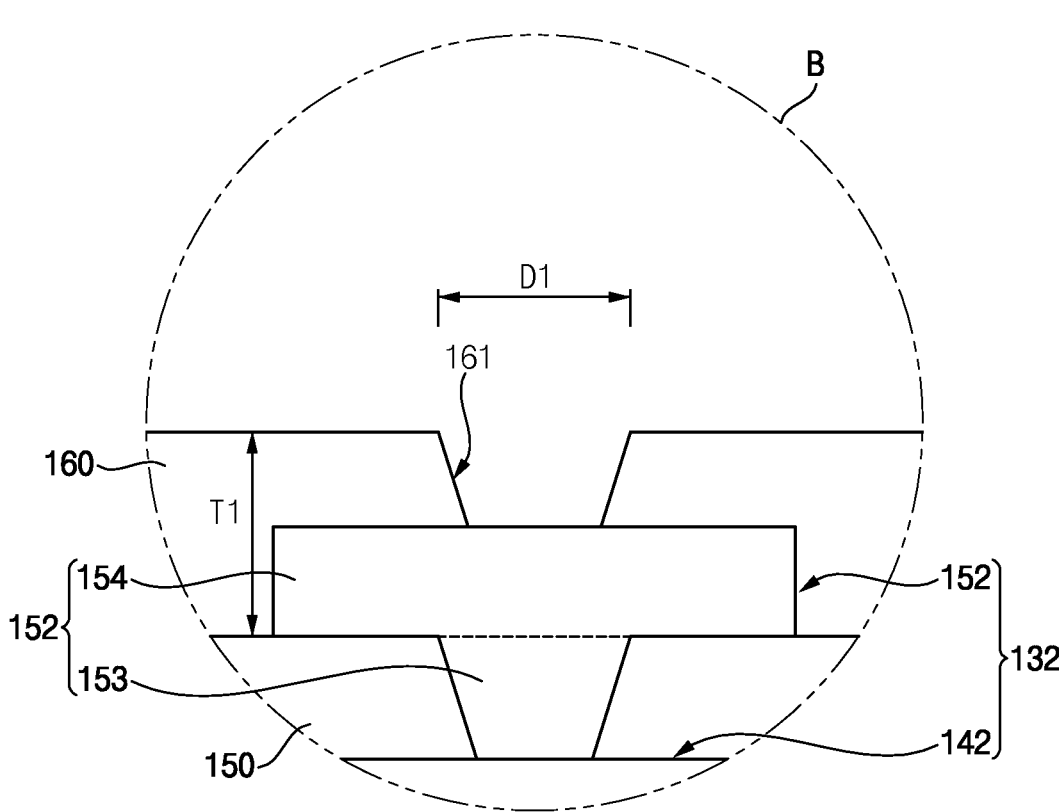

As illustrated in FIGS. 11 to 13, a protective layer 160 may be formed on the upper insulating layer 150, and the protective layer 160 may be patterned to form openings 161 that expose the second upper redistribution wirings 152.

For example, the protective layer 160 may include an insulating film such as ABF. The protective layer 160 may include the same material as or a different material from the upper insulating layer. The protective layer 160 may be formed by a lamination process. An opening may be formed in the protective layer 160 by a laser processing to expose at least a portion of the second upper redistribution wiring 152. A thickness T1 of the protective layer 160 may be within a range of 10 μm to 20 μm. A diameter D1 of the opening 161 of the protective layer 160 may be within a range of 50 μm to 250 μm.

The second upper redistribution wiring 152 may include a redistribution via 153, a redistribution line (not illustrated) and a redistribution pad 154. The redistribution via 153 may be formed to penetrate the upper insulating layer 150. The redistribution line may be formed to extend on the upper insulating layer 150 from the redistribution pad 154. The redistribution pad 154 may be formed on the redistribution via 153 and may be formed at one end portion of the redistribution line.

For example, a diameter of the redistribution pad 154 may be within a range of 300 μm to 350 μm. A thickness of the redistribution pad 154 may be within a range of 5 μm to 15 μm.

Figure 14:
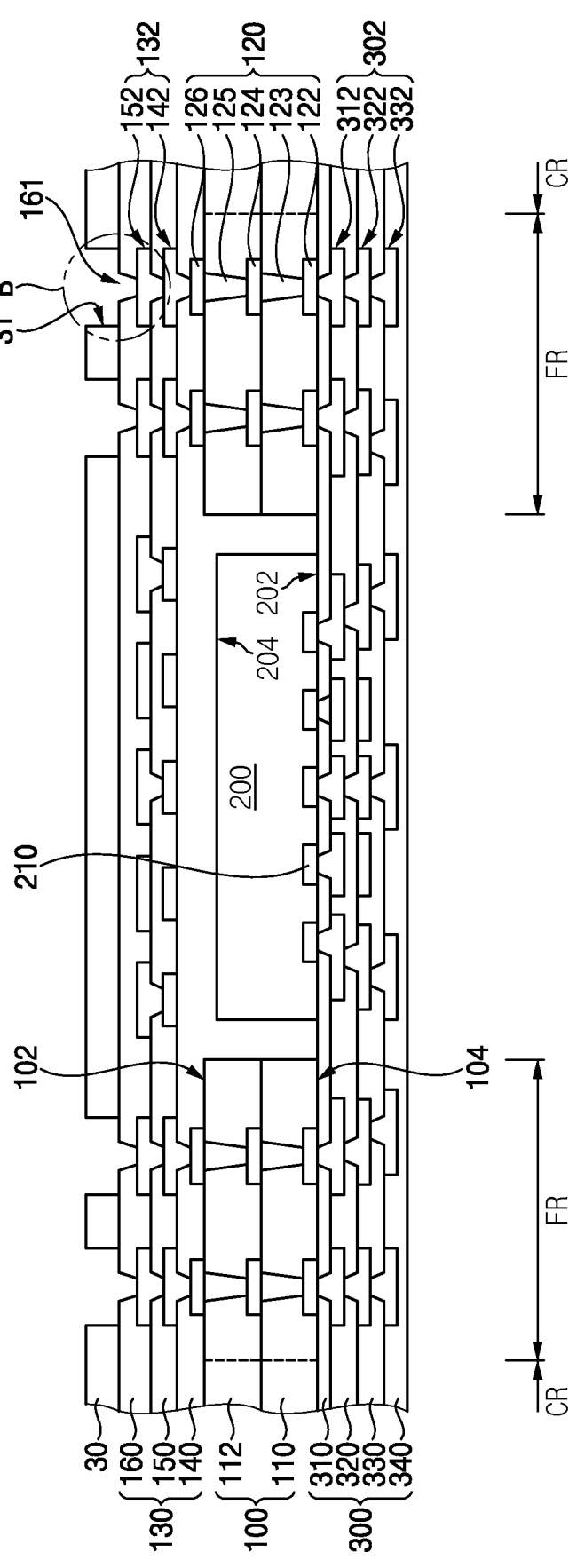
Figure 15:
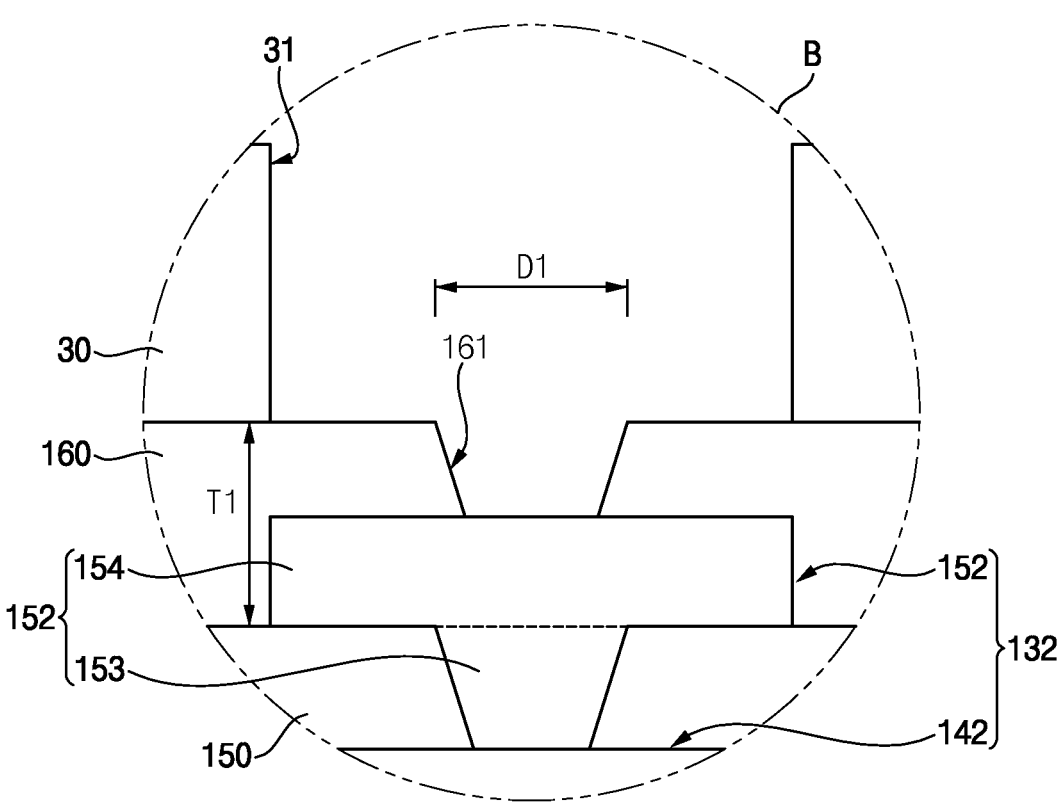

As illustrated in FIGS. 14 and 15, a photosensitive film 30 may be formed on the entire surface of the protective layer 160, and the photosensitive film 30 may be patterned to have a second opening 31 that exposes the second upper redistribution wiring 152.

In exemplary embodiments, the photosensitive film 30 may include dry film resist (DRF). The photosensitive film 30 may be formed by a lamination process. A mask pattern having an opening that exposes a plating pattern region including the region of the opening 161 may be formed on the protective film 160, and a portion of the dry film resist film may be removed by a developing process to form the opening 31 that exposes the bonding pad region (plating pad region).

For example, a thickness of the photosensitive film 30 may be within a range of 40 μm to 60 μm. A diameter of the opening 31 may be within the range of 100 μm to 300 μm.

Figure 16:
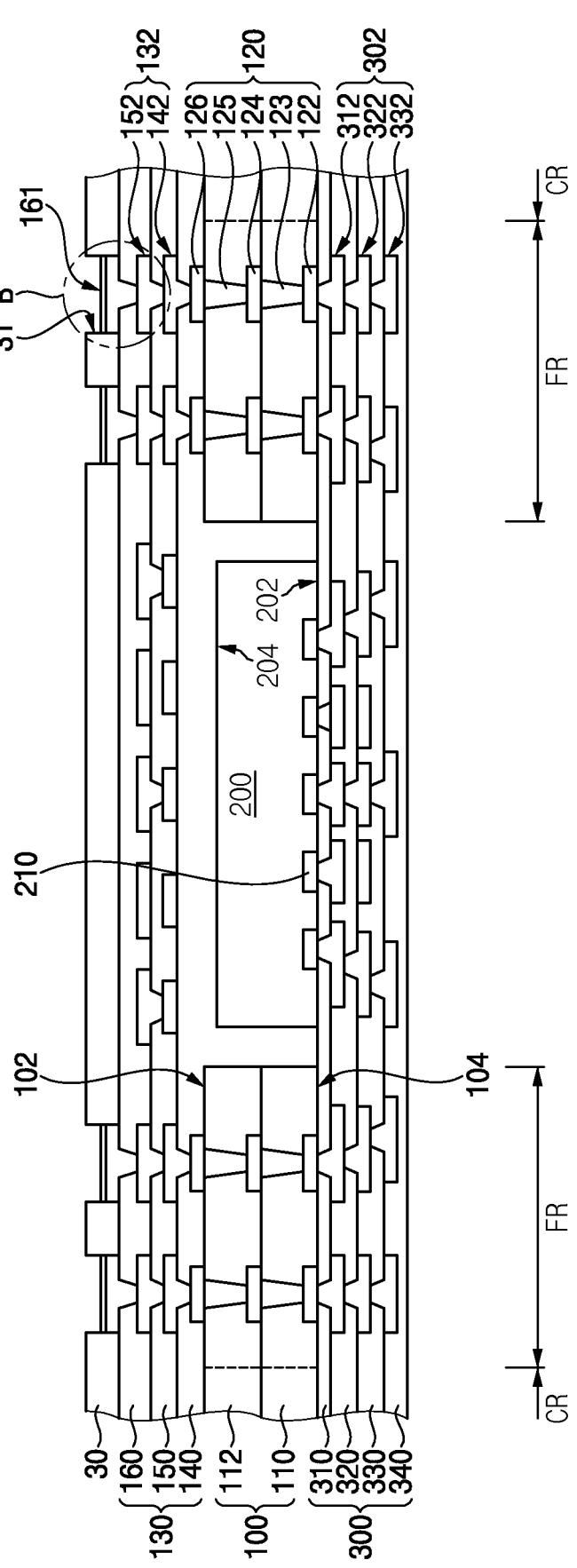
Figure 17:
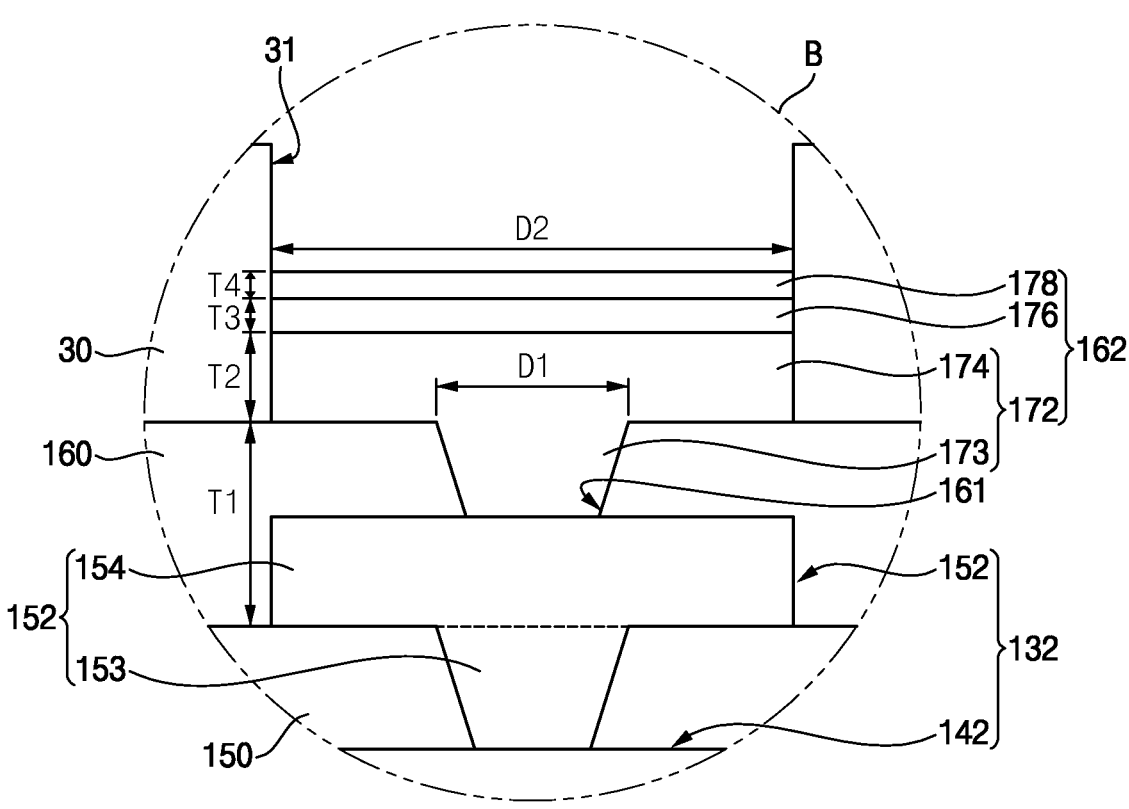

As illustrated in FIGS. 16 and 17, an electrolytic plating process may be performed to form a bonding pad 162 including a first plating pattern 172, a second plating pattern 176 and a third plating pattern 178 sequentially stacked on the second upper redistribution wiring 152. The bonding pad 162 may include a first pad portion provided in the opening 161 of the protective layer 160 and a second pad portion exposed from the opening 161 on the first pad portion.

In particular, an electro plating process may be performed to form the first plating pattern 172 on the second upper redistribution wiring 152. The first plating pattern 172 may include a via pattern 173 filling the opening 161 of the protective layer 160 and a pad pattern 174 exposed from the opening 161 on the via pattern 173. The first plating pattern 172 may include the same material as the second upper redistribution wiring 152. The first plating pattern 172 may include copper (Cu).

A diameter D2 of the pad pattern 174 may be greater than a diameter D1 of the via pattern 173. The diameter D2 of the pad pattern 174 may be within a range of 100 μm to 300 μm. The diameter D1 of the via pattern 173 may be within a range of 50 μm to 250 μm. A thickness T2 of the pad pattern 174 may be within a range of 5 μm to 15 μm.

Then, an electroplating process may be performed to form the second plating pattern 176 in the second opening 31 on the first plating pattern 172. The second plating pattern 176 may include a material serving as an anti-diffusion layer between a solder alloy and the first plating pattern 172 in a following soldering process. For example, the second plating pattern 176 may include nickel (Ni).

A thickness T3 of the second plating pattern 176 may be smaller than a thickness T2 of the pad pattern 174. A thickness T3 of the second plating pattern 176 may be within a range of 2 μm to 8 μm. A diameter of the second plating pattern 176 may be the same as the diameter D2 of the via pattern 174.

Then, an electroplating process may be performed to form the third plating pattern 178 in the second opening 31 on the second plating pattern 176. The third plating pattern 178 may include a material for wetting with a solder material in the following soldering process. For example, the third plating pattern 178 may include gold (Au).

A thickness T4 of the third plating pattern 178 may be smaller than the thickness T3 of the second plating pattern 176. A thickness T4 of the third plating pattern 178 may be within a range of 0.2 μm to 1 μm.

Accordingly, the bonding pad 162 including the first plating pattern 172, the second plating pattern 176 and the third plating pattern 178 sequentially stacked on the uppermost redistribution wiring 152 of the second redistribution wirings 132.

Figure 18:
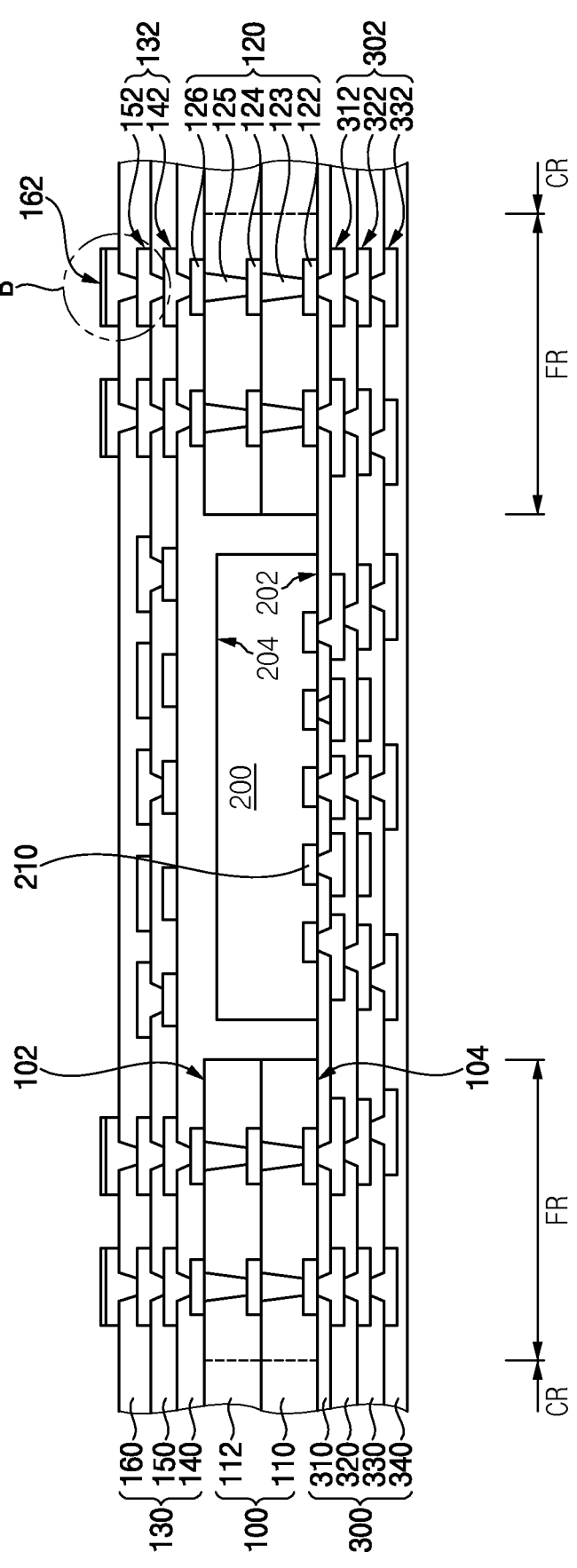
Figure 19:
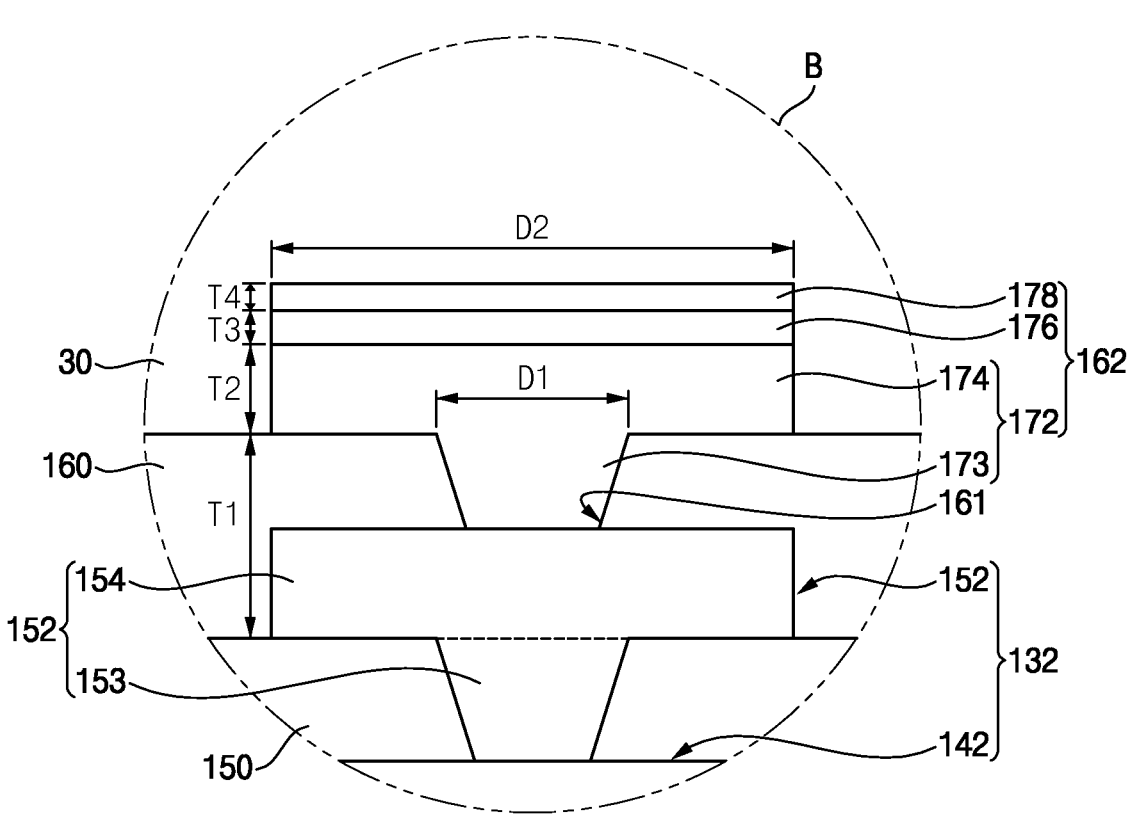

As illustrated in FIGS. 18 and 19, the photosensitive film 30 may be removed from the protective layer 160 and an etching process may be performed on the protective layer 160 on which the bonding pad 162 is formed. The etching process may be performed to etch a seed layer used in the electroplating process or to remove a seed layer used to form the bump pads such as UBM on the front redistribution wiring layer.

Accordingly, an upper redistribution wiring layer 130 covering the first surface 102 of the core substrate and including the sealing layer 140, the upper insulating layer 150, the protective layer 160 and the bonding pads 162 may be formed.

The protective layer 160 may serve as a passivation layer. For example, the protective layer 160 may include the insulating film ABF the same as the sealing layer 140 and the upper insulating film 150. A portion of the bonding pad 162 may be formed within the opening 161 of the protective layer 160 and the remaining portion of the bonding pad 162 may be exposed through the opening 161. That is, the bonding pad 162 may have a Non-Solder Mask Defined (NSMD) type pad structure. Accordingly, a contact area between the first plating pattern 172 including copper (Cu) and the protective layer 160 may become relatively large, and a contact area between the third plating pattern 178 including gold (Au) and the protective layer 160 may become relatively small. Thus, it may be possible to prevent cracks from occurring due to a relatively high adhesive force between the bonding pad and the protective layer during a temperature cycle (TC).

Figure 20:
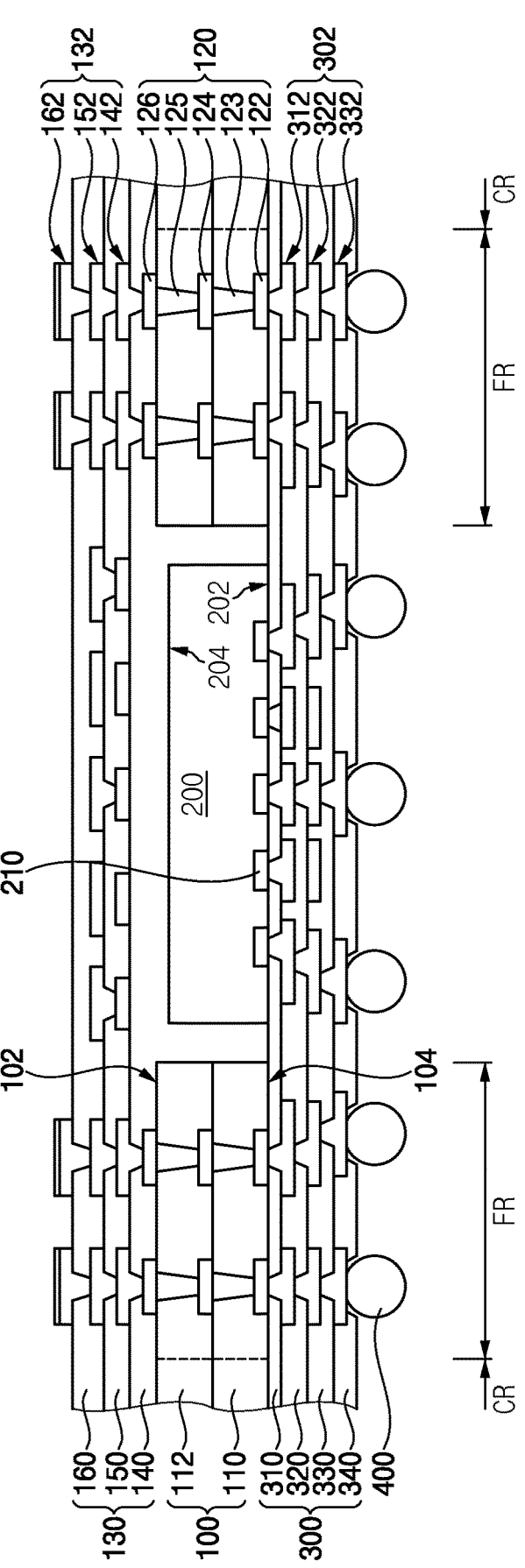

Referring to FIG. 20, external connection members 400 may be formed on an outer surface of the lower redistribution wiring layer 300 to be electrically connected to the first redistribution wirings 302.

In exemplary embodiments, after removing the second carrier substrate, a solder ball an external connection member may be formed on the bump pad on the third lower redistribution wiring 332. In this case, the bump pad on the third lower redistribution wiring 332 may serve as a landing pad, that is, a package pad. Thus, the lower redistribution wiring layer 300 having fan-out type solder ball landing pads may be formed by performing semiconductor manufacturing processes.

Then, the core substrate 100 may be individualized by a sawing process to complete the fan out panel level package 10 of FIG. 1 including the core substrates 100, the lower redistribution wiring layer 300 formed on the lower surface of the core substrate 100 and the upper redistribution wiring layer 130 formed on the upper surface of the core substrate 100.

Figure 21:
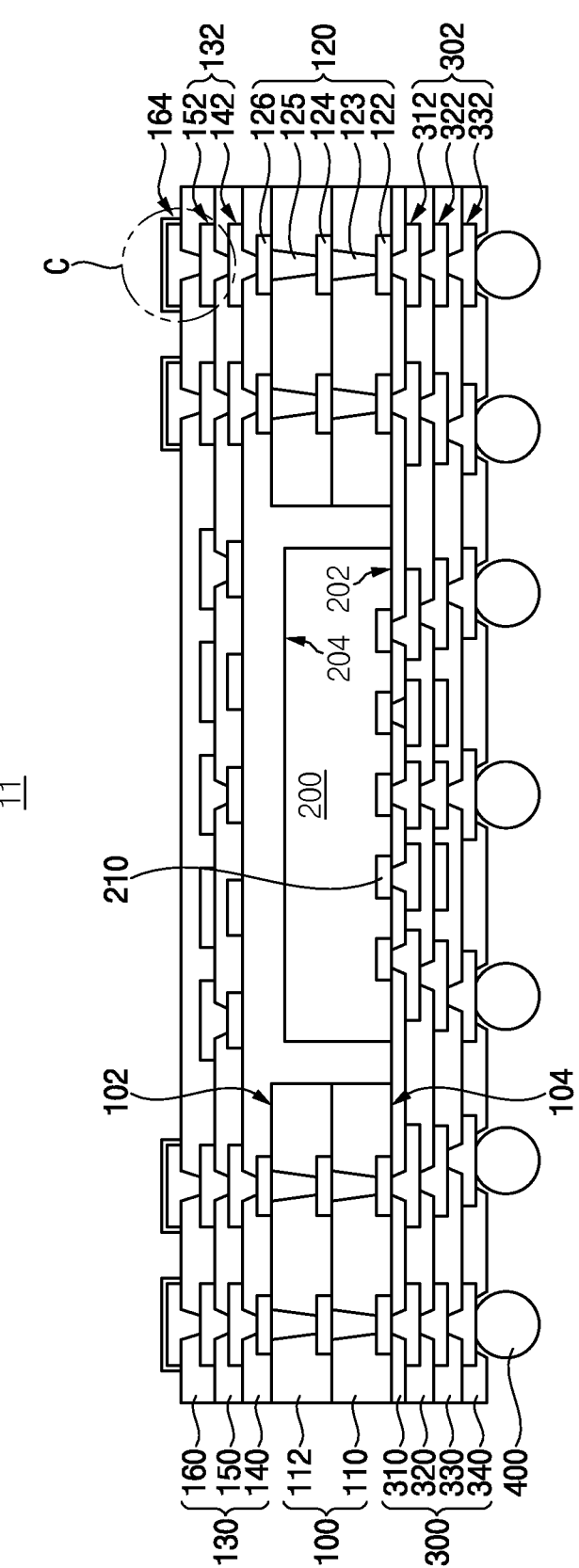
Figure 22:
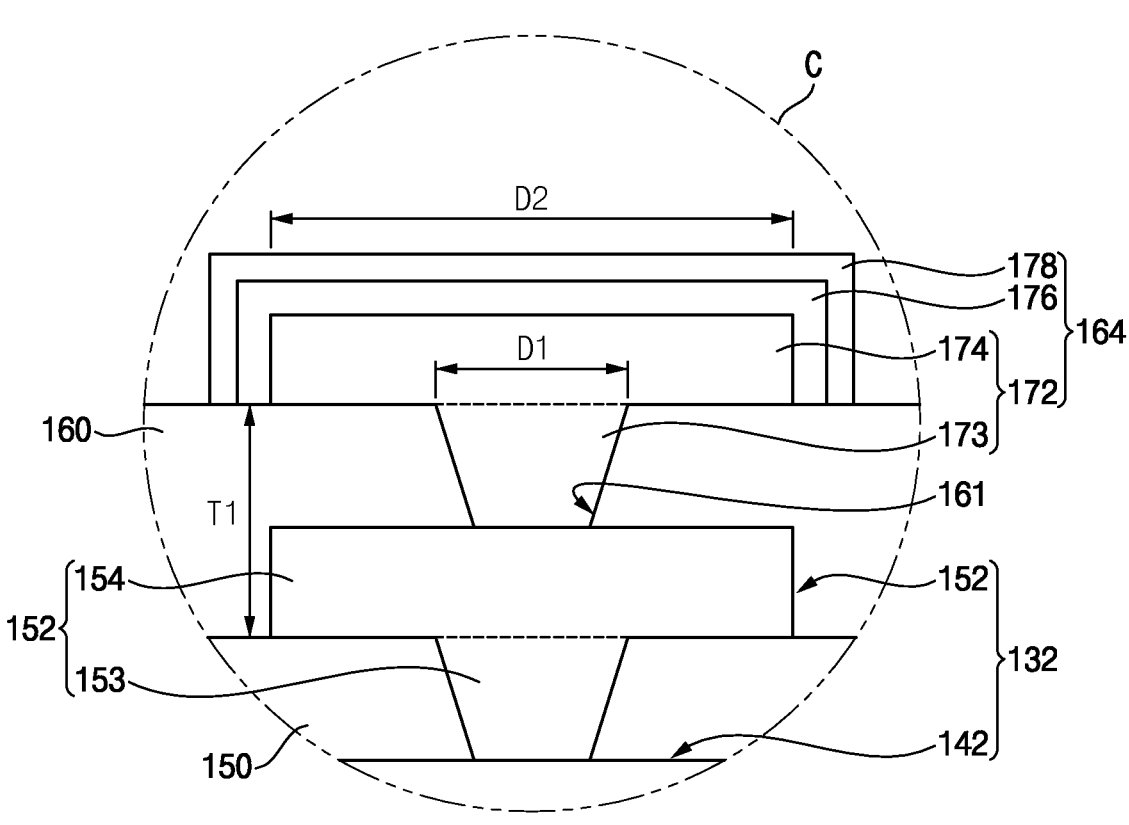

FIG. 21 is a cross-sectional view illustrating a semiconductor package in accordance with exemplary embodiments. FIG. 22 is an enlarged cross-sectional view illustrating portion 'C' in FIG. 21. The semiconductor package may be substantially the same as the semiconductor package described with reference to FIGS. 1 and 2 except for the configurations of the bonding pads. Thus, the same reference numerals may be used to refer to the same or like elements and any further repetitive explanation concerning the above elements will be omitted as redundant.

Referring to FIGS. 21 and 22, an upper redistribution wiring layer 130 of a semiconductor package 11 may include a sealing layer 140 on a backside surface 204 of a semiconductor chip 200 and a first surface 102 of a core substrate 100, at least one upper insulating layer 150 disposed on the sealing layer 140 and having second redistribution wirings 132 electrically connected to the core connection wirings 120 respectively, a protective layer 160 provided on the at least one upper insulating layer 150 and having an opening 161 that exposes at least a portion of an uppermost redistribution wiring 152 among the second redistribution wirings 132, and a bonding pad 164 provided on the protective layer 160 and electrically connected to the uppermost redistribution wiring 152 through the opening 161. The sealing layer, the upper insulating layer and the protective layer of the semiconductor package 11 may be substantially the same as or similar to detailed components of the upper redistribution wiring layer 130 of the semiconductor package 10 of FIG. 1. Therefore, detailed descriptions thereof will be omitted as redundant.

In exemplary embodiments, a first plating pattern 172 may be provided on a second upper redistribution wiring 152. The first plating pattern 172 may include a via pattern 173 filling the opening 161 of the protective layer 160 and a pad pattern 174 exposed from the opening 161 on the via pattern 173. The pad pattern 174 of the first plating pattern 172 may be exposed from the protective layer 160.

A second plating pattern 176 may be provided on the first plating pattern 172. The second plating pattern 176 may be formed on a surface of the pad pattern 174 exposed by the protective layer 160. Accordingly, the second plating pattern 176 may cover an upper surface and a side surface of the first plating pattern 172 exposed by the opening 161.

The third plating pattern 178 may be provided on the second plating pattern 176. The third plating pattern 173 may be formed on a surface of the second plating pattern 176 exposed by the protective layer 160. Accordingly, the third plating pattern 178 may cover an upper surface and a side surface of the second plating pattern 176.

Hereinafter, a method of manufacturing the semiconductor package of FIG. 21 will be described.

Figure 23:
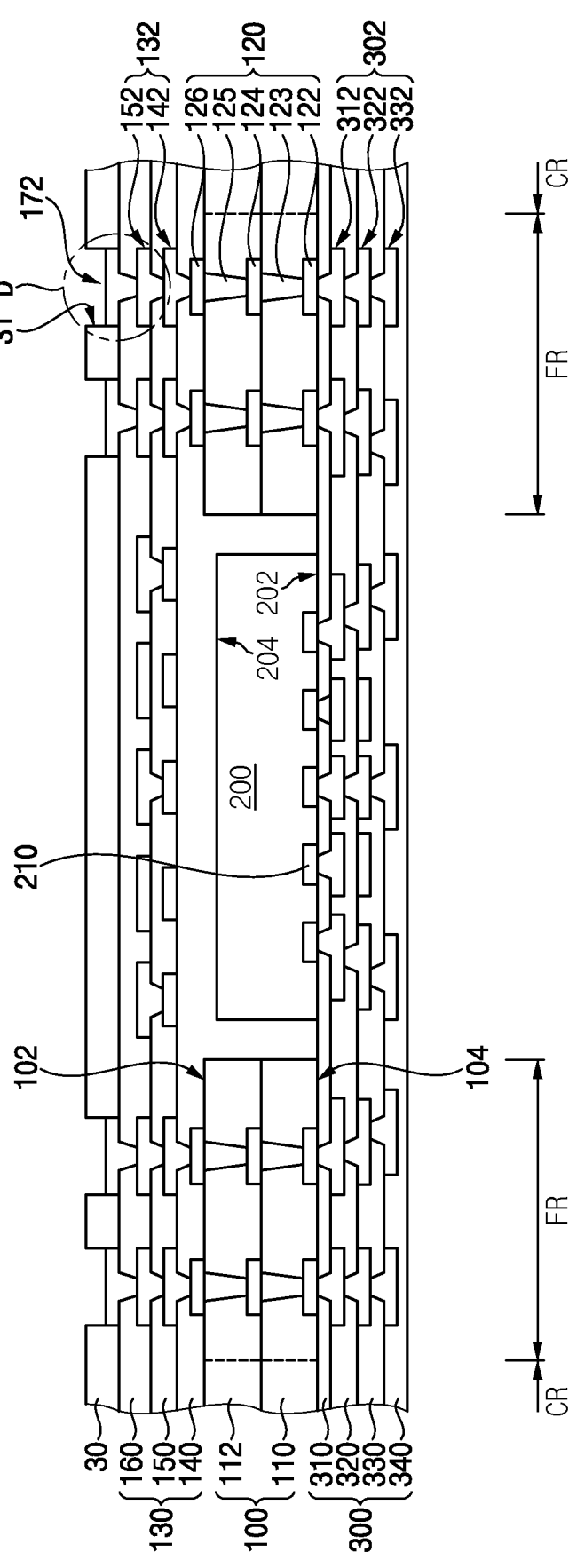
Figure 24:
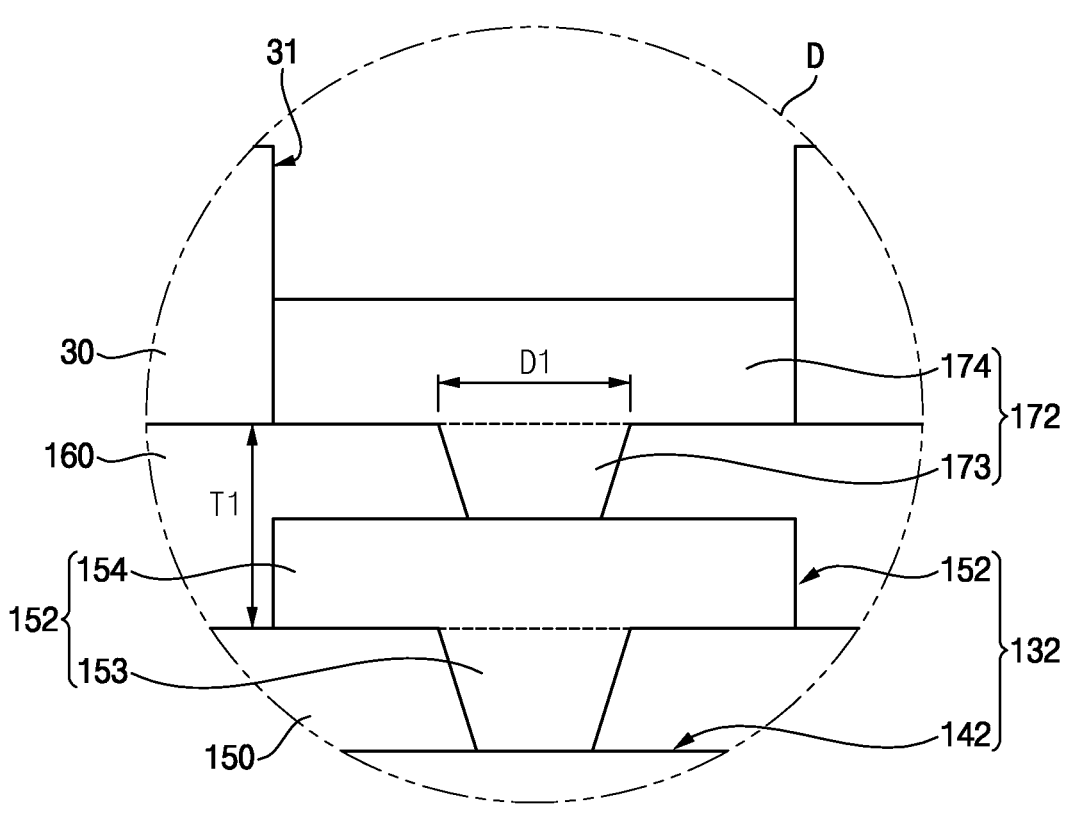
Figure 25:
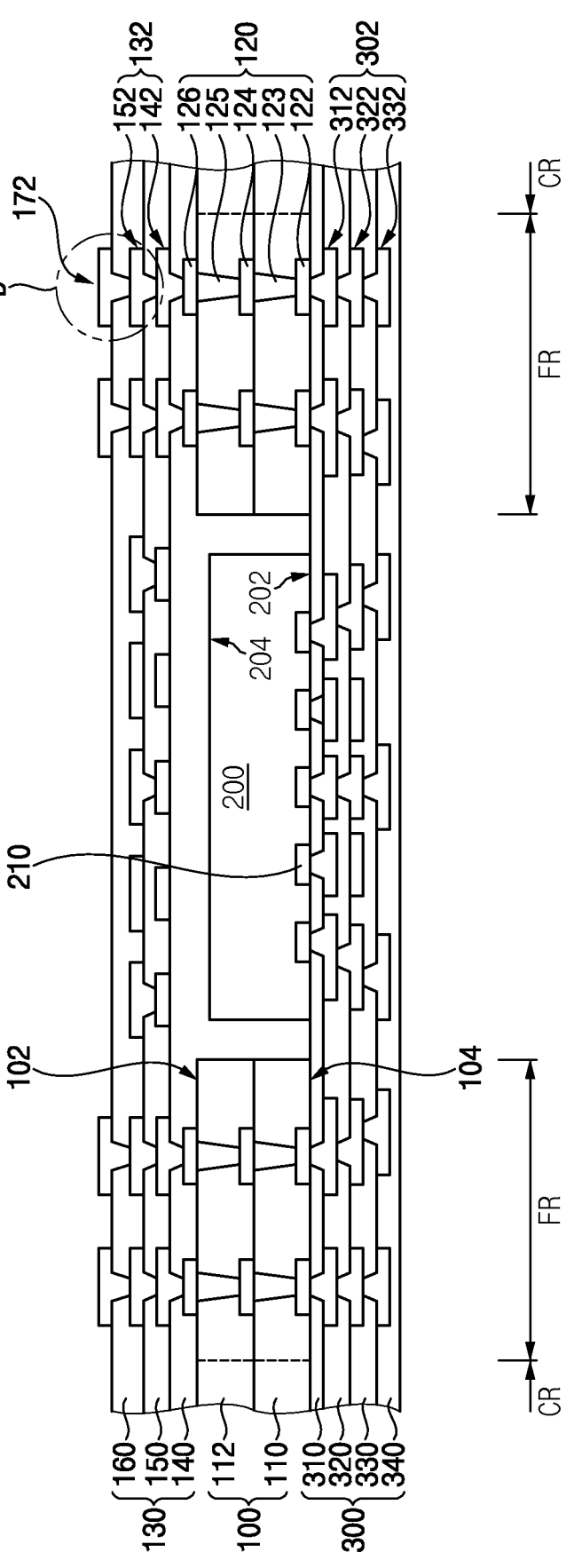
Figure 26:
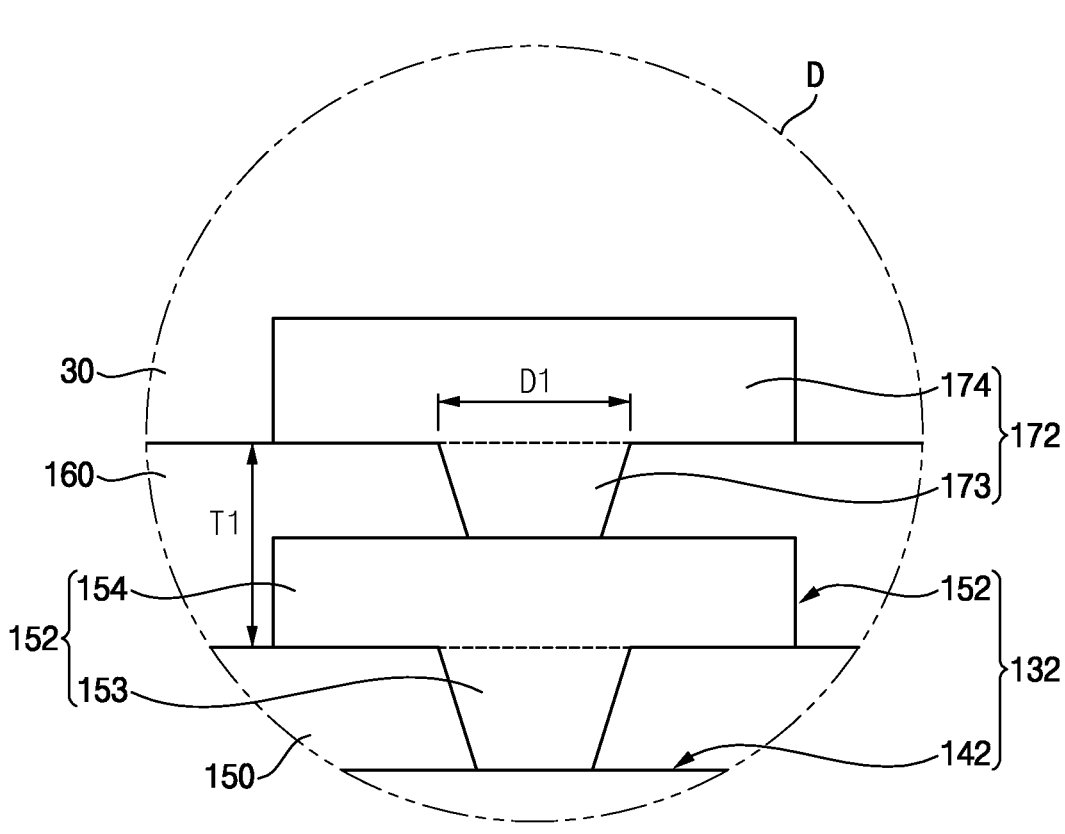
Figure 27:
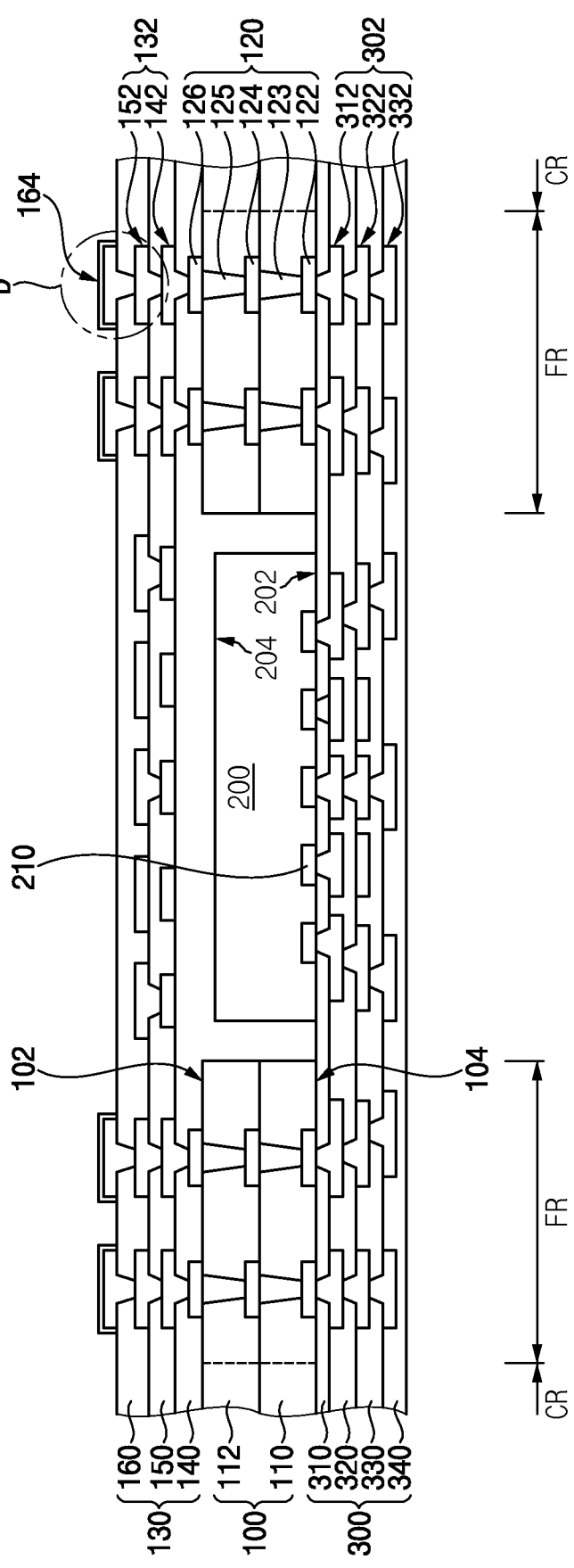
Figure 28:
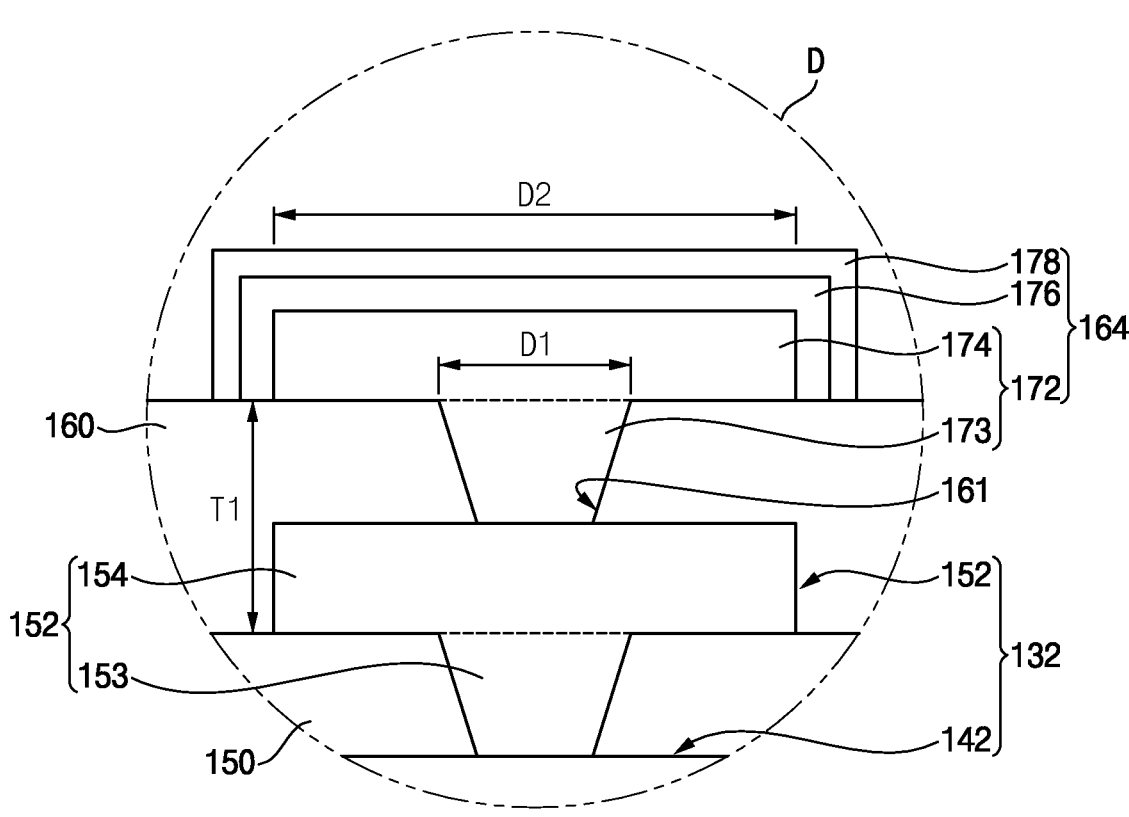

FIGS. 23 to 28 are cross-sectional views illustrating a method of manufacturing a semiconductor package in accordance with exemplary embodiments. FIGS. 24, 26 and 28 are enlarged cross-sectional views illustrating portions 'D' in FIGS. 23, 25 and 27 respectively.

Referring to FIGS. 23 and 24, first, processes the same as or similar to the processes described with reference to FIGS. 4 to 14 may be performed to form a photosensitive film 30 having a second opening 31 that exposes a second upper redistribution wiring 152 on the entire surface of a protective layer 160, and to form a first plating pattern 172 on the second upper redistribution wiring 152.

In exemplary embodiments, the first plating pattern 172 may be formed on the second upper redistribution line 152 by performing an electroplating process. The first plating pattern 172 may include a via pattern 173 filling an opening 161 of the protective layer 160 and a pad pattern 174 exposed from the opening 161 on the via pattern 173. The first plating pattern 172 may include the same material as the second upper redistribution 152. The first plating pattern 172 may include copper (Cu).

Referring to FIGS. 25 and 26, the photosensitive film 30 may be removed from the protective layer 160, and an etching process may be performed on the protective layer 160. A seed layer used in the electrolytic plating process may be etched by the etching process. Accordingly, the pad pattern 174 of the first plating pattern 172 may be exposed from the protective layer 160.

Referring to FIGS. 27 and 28, a second plating pattern 176 may be formed on the first plating pattern 172 by performing an electroless plating process. The second plating pattern 176 may be formed on a surface of the pad pattern 174 exposed by the protective layer 160. Accordingly, the second plating pattern 176 may cover an upper surface and a side surface of the first plating pattern 172 exposed through the opening 161.

Then, a third plating pattern 178 may be formed on the second plating pattern 176 by performing an electroless plating process. The third plating pattern 173 may be formed on a surface of the second plating pattern 176 exposed by the protective layer 160. Accordingly, the third plating pattern 178 may cover an upper surface and a side surface of the second plating pattern 176.

Thus, a bonding pad 164 including the first plating pattern 172, the second plating pattern 176 and the third plating pattern 178 sequentially stacked on the uppermost redistribution wiring 152 of the second redistribution wiring 132 may be formed.

Then, processes that are the same as or similar to the processes described with reference to FIG. 20 may be performed to complete the semiconductor package 11 of FIG. 21.

Figure 29:
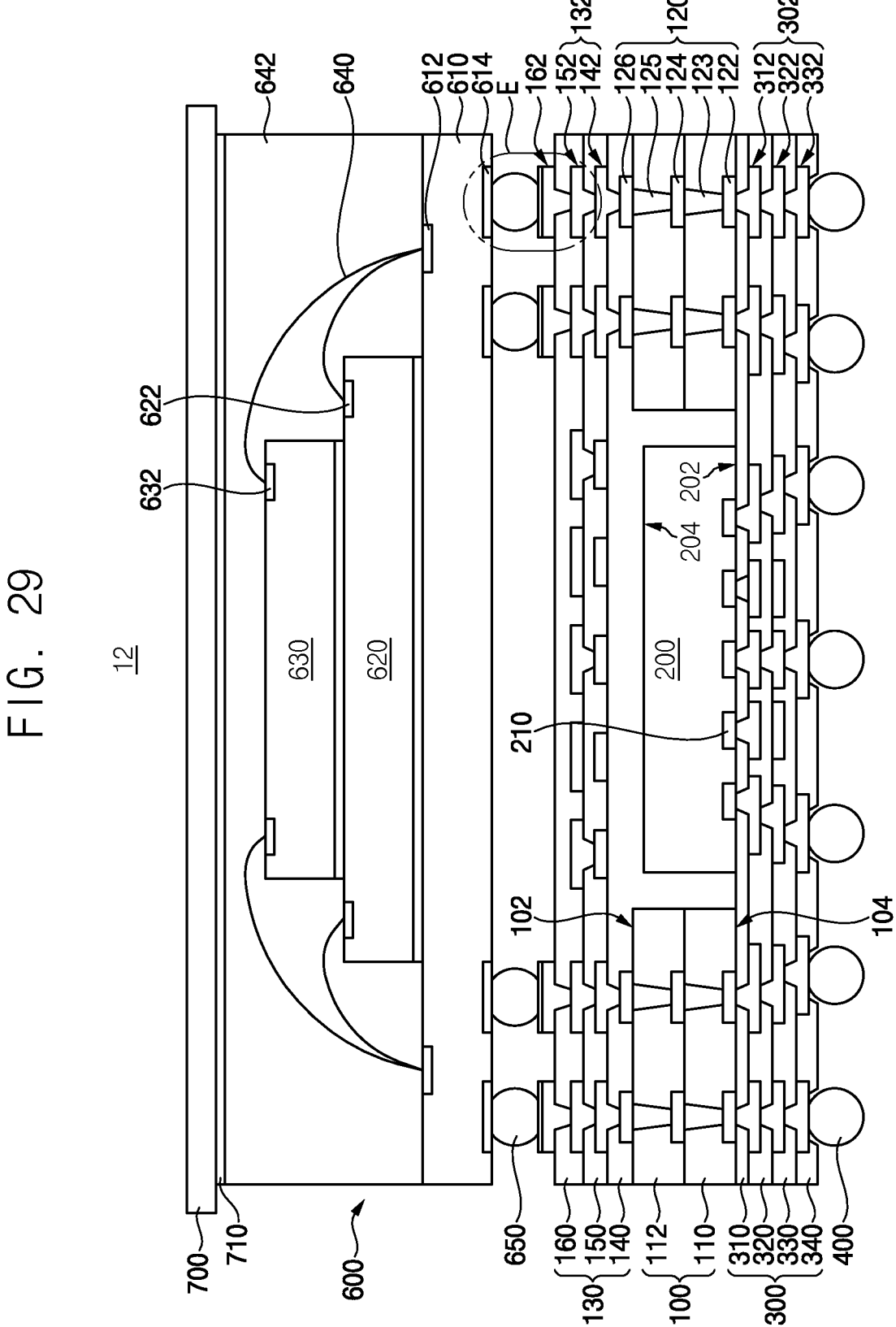
Figure 30:
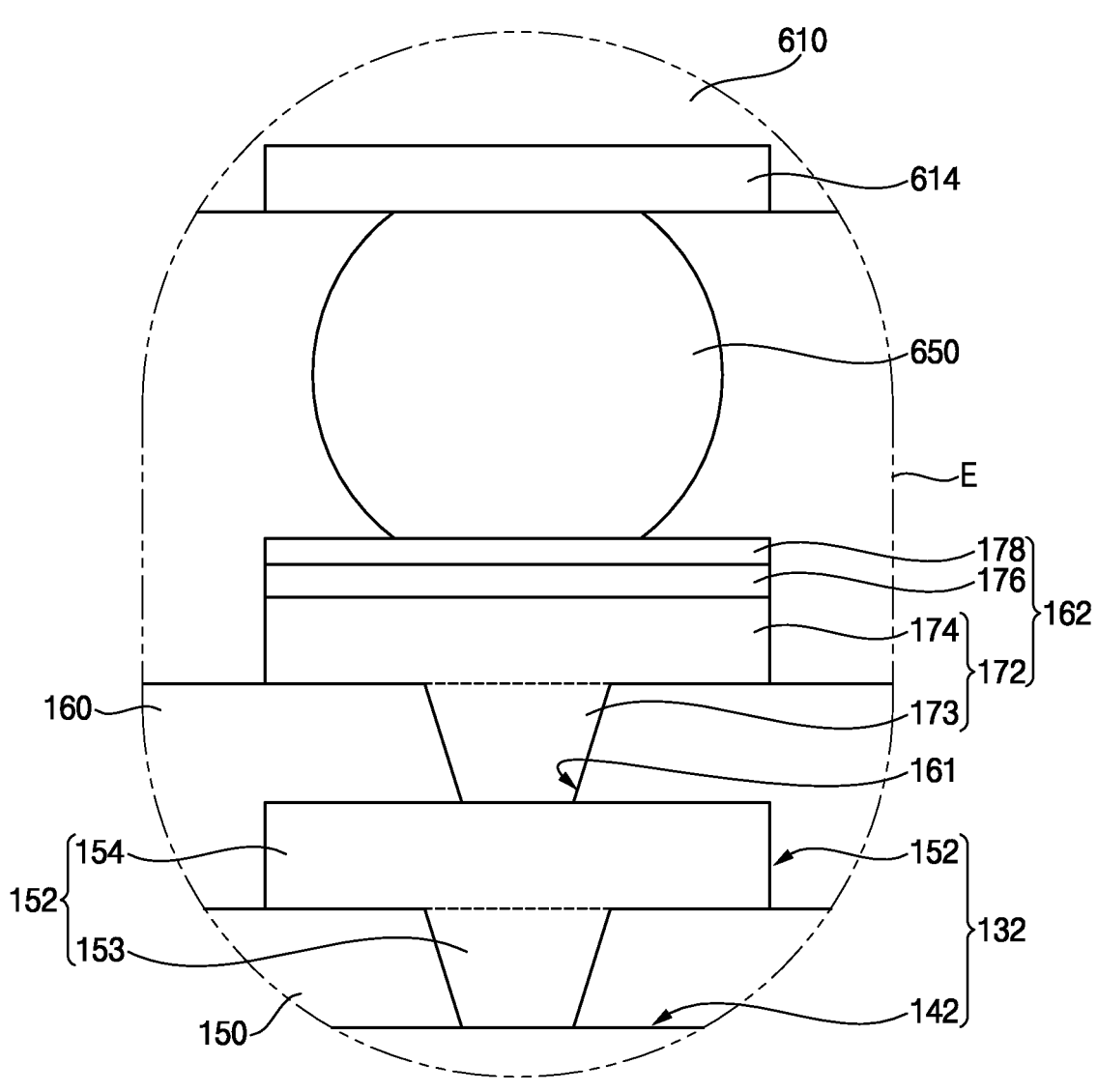

FIG. 29 is a cross-sectional view illustrating a semiconductor package in accordance with exemplary embodiments. FIG. 30 is an enlarged cross-sectional view illustrating portion 'E' in FIG. 29. The semiconductor package may be substantially the same as the semiconductor package described with reference to FIG. 1 except for an additional second package. Thus, same reference numerals may be used to refer to the same or like elements and any further repetitive explanation concerning the above elements will be omitted as redundant.

Referring to FIGS. 29 and 30, a semiconductor package 12 may include a first package and a second package 600 stacked on the first package. The semiconductor package 12 may further include a heat sink 700 stacked on the second package 600. The first package may include a core substrate 100, a semiconductor chip 200, a lower redistribution wiring layer 300 and an upper redistribution wiring layer 130. The first package may be substantially the same as or similar to the unit package described with reference to FIG. 1.

In exemplary embodiments, the second package 600 may include a second package substrate 610, second and third semiconductor chips 620 and 630 mounted on the second package substrate 610 and a sealing member 642 on the second package substrate 610 covering the second and third semiconductor chips 620 and 630.

The second package 600 may be stacked on the first package via conductive connection members 650. For example, the conductive connection members 650 may include solder balls, conductive bumps, or the like.

As illustrated in FIG. 30, the conductive connection member 650 may be disposed between a bonding pad 162 of the upper redistribution wiring layer 130 and a second connection pad 614 of the second package substrate 610. Accordingly, the first package and the second package 600 may be electrically connected to each other by the conductive connection members 650.

The second and third semiconductor chips 620 and 630 may be stacked on the second package substrate 610 by adhesive members. Bonding wirings 640 may connect chip pads 622 and 632 of the second and third semiconductor chips 620 and 630 to first connection pads 612 of the second package substrate 610. The second and third semiconductor chips 620 and 630 may be electrically connected to the second package substrate 610 through the bonding wirings 640.

Although the second package 600 includes two semiconductor chips mounted by a wiring bonding method, it will be understood that the number of the semiconductor chips in the second package and the mounting method are not limited thereto.

In exemplary embodiments, the heat sink 700 may be provided on the second package 600 to dissipate heat from the first and second packages to the exterior. The heat sink 700 may be attached on the second package 600 by a thermal interface material (TIM) 710.

Figure 31:
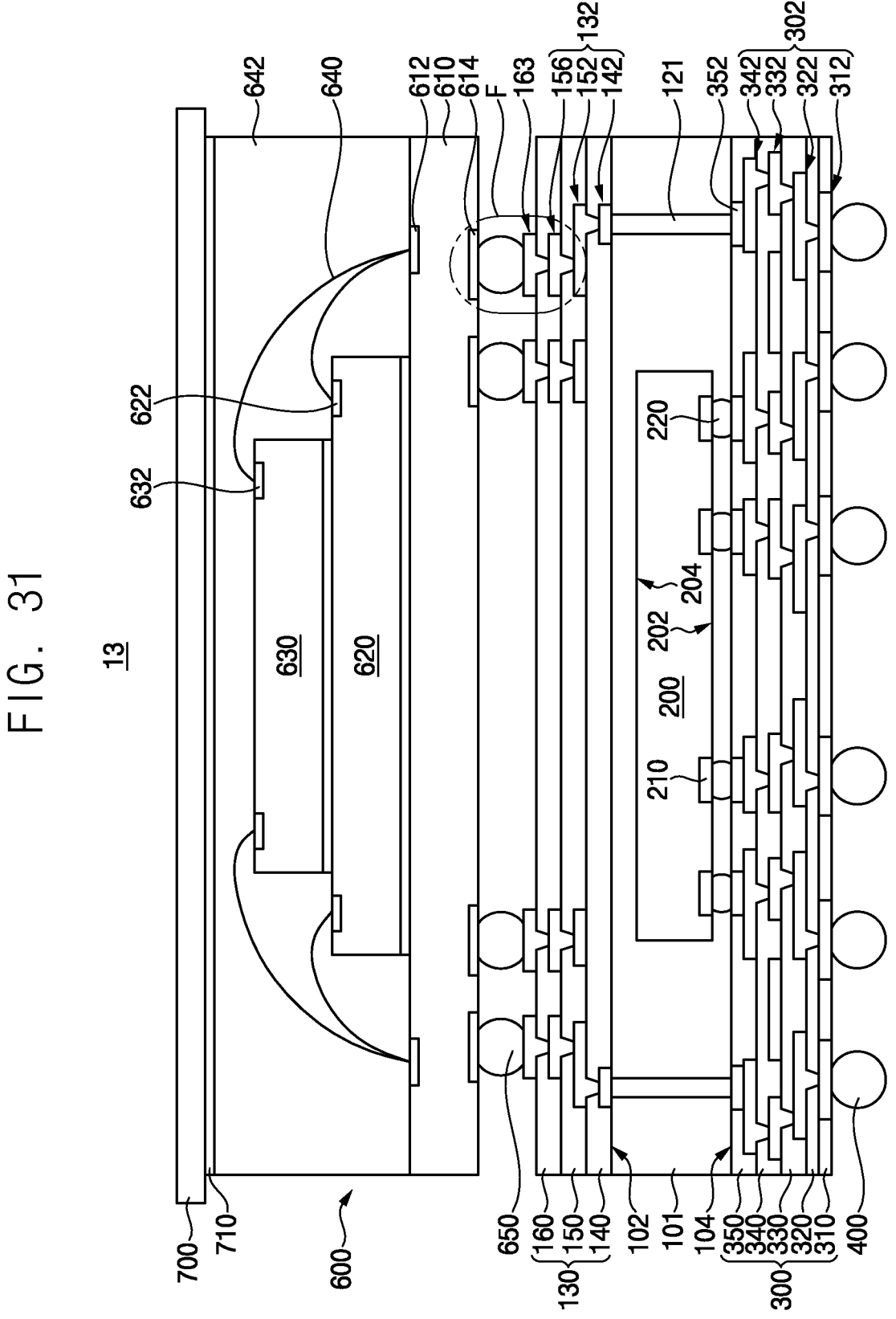
Figure 32:
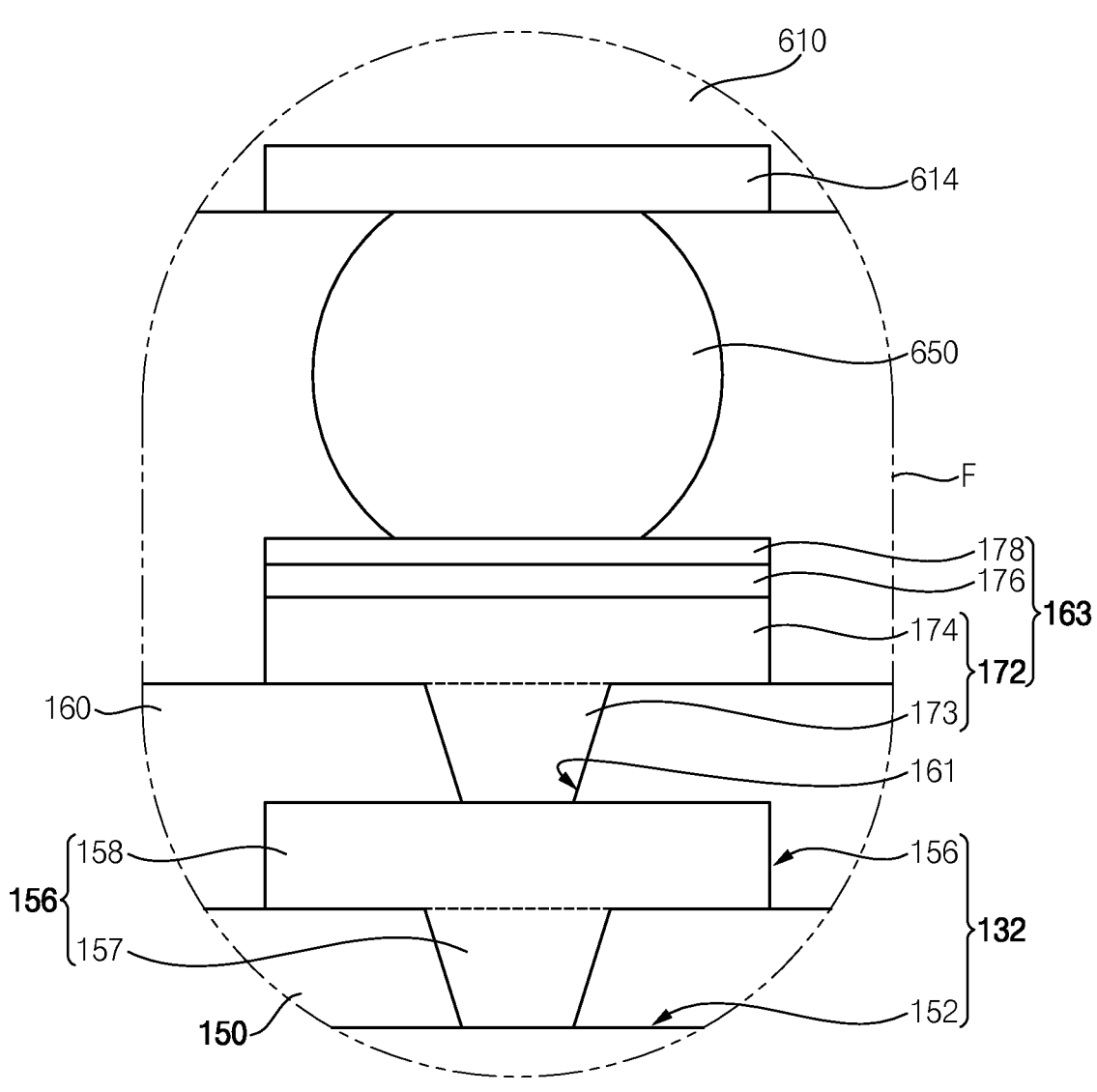

FIG. 31 is a cross-sectional view illustrating a semiconductor package in accordance with exemplary embodiments. FIG. 32 is an enlarged cross-sectional view illustrating portion 'F' in FIG. 31. The semiconductor package may be substantially the same as the semiconductor package described with reference to FIG. 29 except for configurations of a base substrate and a lower redistribution wiring layer. Thus, the same reference numerals may be used to refer to the same or like elements and any further repetitive explanation concerning the above elements will be omitted as redundant.

Referring to FIGS. 31 and 32, a semiconductor package 13 may include a lower redistribution wiring layer 300, at least one semiconductor chip 200 disposed on the lower redistribution wiring layer 300, a sealing member 101 on the lower redistribution wiring layer 300 covering the at least one semiconductor chip 200, and an upper redistribution wiring layer 130 disposed on the sealing member 101. In addition, the semiconductor package 13 may further include external connection members 400 disposed on an outer surface of the lower redistribution wiring layer 300.

In exemplary embodiments, the lower redistribution wiring layer 300 may include a plurality of first redistribution wirings 302. The first redistribution wirings 302 may be electrically connected to chip pads 210 of the semiconductor chip 200 and conductive structures 120, respectively. The first redistribution wirings 302 may be provided on a front surface 202 of the semiconductor chip 200 and a second surface 104 of the sealing member 101 to serve as front redistribution wirings. Accordingly, the lower redistribution wiring layer 300 may be a front redistribution wiring layer of a fan out package.

For example, the lower redistribution wiring layer 300 may include first, second, third, fourth and fifth lower insulating layers 310, 320, 330, 340 and 350 sequentially stacked. The first redistribution wirings 302 may include first, second, third and fourth lower redistribution wirings 312, 322, 332 and 342 provided in the first, second, third, fourth and fifth lower insulating layers 310, 320, 330, 340 and 350.

The lower redistribution wiring layer 300 may include a first bonding pad 352 formed on a fourth lower redistribution wiring 342 as an uppermost first redistribution wiring. For example, the first bonding pad 352 may have the same or similar structure as a second bonding pad 163 to be described later.

The fifth lower insulating layer 350 may cover the fourth lower redistribution wirings 342 on the fourth lower insulating layer 340 and may include an opening that exposes at least a portion of the first bonding pad 352. The fifth lower insulating layer 350 may include a solder resist layer serving as a passivation layer. Accordingly, the first bonding pads 352 may be exposed from an upper surface of the lower redistribution wiring layer 300.

In exemplary embodiments, the semiconductor chip 200 may be disposed on the lower redistribution wiring layer 300. The semiconductor chip 200 may be mounted on the lower redistribution wiring layer 300 by a flip chip bonding method. In this case, the semiconductor chip 200 may be mounted on the lower redistribution wiring layer 300 such that an active surface on which the chip pads 210 are formed faces the lower redistribution wiring layer 300. The chip pads 210 of the semiconductor chip 200 may be electrically connected to the first bonding pads 352 of the lower redistribution wiring layer 300 by conductive bumps 220 as conductive connection members. For example, the conductive bumps 220 may include micro bumps (uBumps).

In this exemplary embodiment, a structure in which the chip pads 210 of the semiconductor chip 200 are electrically connected to the first bonding pads 352 of the lower redistribution wiring layer 300 by the conductive bumps 220 is provided as examples, however, it may not be limited thereto, for example, the chip pads 210 of the semiconductor chip 200 may be directly connected to the first bonding pads 352 of the lower redistribution wiring layer 300 without the intervening conductive bumps.

In other exemplary embodiments, the conductive structures 120 may be disposed on the first bonding pads 352 respectively, and the sealing member 101 may cover the semiconductor chip 200 and the conductive structures 120 on the lower redistribution wiring layer 300. For example, the sealing member 101 may include an epoxy molding compound (EMC) or an insulating film such as ABF. The sealing member 101 may be formed to cover an upper surface and a side surface of the semiconductor chip 200.

The conductive structures 121 may vertically extend through the sealing member 101. One end of the conductive structure 121 may be connected to the first bonding pad 352 of the lower redistribution wiring layer 300 and the other end of the conductive structure 121 may be exposed from a first surface 102 of the sealing member 101. The conductive structure 121 may include a through via.

For example, the conductive structure 121 may include a pillar shape, a bump shape, etc. The conductive structure 121 includes nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), etc.

In further exemplary embodiments, the upper redistribution wiring layer 130 may include first and second upper insulating layers 140 and 150 disposed on the sealing member 101 and having second redistribution wirings 142, 152 and 156 electrically connected to the conductive structures 120 respectively, a protective layer provided on the first and second upper insulating layers 140 and 150 and having an opening 161 that exposes at least a portion of an uppermost redistribution wiring 156 among the second redistribution wirings, and a second bonding pad 163 disposed on the uppermost redistribution wiring 156 exposed by the opening 161. The second redistribution wirings 142, 152 and 156 may be provided on the first surface 102 of the sealing member 101 to serve as backside redistribution wirings. Accordingly, the upper redistribution wiring layer may be a backside redistribution wiring layer of the fan out package.

The upper redistribution wiring layer 130 may include the first upper insulating layer 140 provided on the first surface 102 of the sealing member 101 and the second upper insulating layer 150 disposed on the first upper insulating layer 140.

The first upper redistribution wirings 142 may be provided at the other ends of the conductive structures 121. The first upper insulating layer 140 may be provided on the sealing member 101 and may have openings that expose first upper redistributive wirings 142. Second upper redistribution wirings 152 may be formed on the first upper insulating layer 140 and at least portions of the second upper redistribution wirings 152 may directly contact the first upper redistribution wirings 142 through the openings of the first upper insulating layer 140.

The second upper insulating layer 150 may be provided on the first upper insulating layer 140 and may have openings that expose the second upper redistribution wirings 152. Third upper redistributive wirings 156 may be formed on the second upper insulating layer 150 and at least portions of the third upper redistribution wirings 156 may directly contact the second upper redistributable wirings 152 through the openings of the second upper insulating layer 150.

The upper redistribution wiring layer 130 may include the first upper redistribution wiring 142, the second upper redistribution wiring 152 and the third upper redistribution wiring 156 stacked in three layers. In this case, the third upper redistribution wiring may correspond to the uppermost redistribution wiring among the second redistribution wirings. In this case also, the second bonding pad may be formed on the third upper redistribution wiring.

As illustrated in FIG. 32, in exemplary embodiments, the protective layer 160 may be provided on the second upper insulating layer 150 and may have an opening 161 that exposes at least a portion of the uppermost redistribution wiring 156 among the second redistribution wirings 132.

The second bonding pad 163 may include a first pad portion provided in the opening 161 of the protective layer 160 and a second pad portion exposed from the opening 161 on the first pad portion. The second bonding pad 163 may include a first plating pattern 172, a second plating pattern 176 and a third plating pattern 178 sequentially stacked on the third upper redistribution wiring 156.

In particular, the first plating pattern 172 may include a via pattern 173 filling the opening 161 of the protective layer 160 and a pad pattern 174 exposed from the opening 1610 on the via pattern 173. The first plating pattern 172 may include the same material as the second upper redistribution wiring 152. For example, the first plating pattern 172 may include copper (Cu).

The second plating pattern 176 may be formed on the first plating pattern 172. For example, the second plating pattern 176 may include nickel (Ni). The third plating pattern 178 may be formed on the second plating pattern 176. For example, the third plating pattern 178 may include gold (Au).

The protective layer 160 may serve as a passivation layer. For example, the protective layer 160 may include an insulating film such as ABF the same as the first and second upper insulating layers 140 and 150. A portion of the second bonding pad 163 may be formed within the opening 161 of the protective layer 160 and the remaining portion of the second bonding pad 163 may be exposed through the opening 161. That is, the second bonding pad 163 may have a non-solder mask defined (NSMD) type pad structure.

The first, second, and third plating patterns 172, 176 and 178 of the second bonding pad 163 may be substantially the same as or similar to detailed structures of the bonding pad 162 of FIG. 2. Thus, a detailed description thereof will be omitted as redundant.

As mentioned above, the semiconductor package 13 may include a fan out wafer level package including include the sealing member 101, the lower redistribution wiring layer 300 formed on the lower surface of the sealing member 101 and the upper redistribution wiring layer 130 formed on the upper surface of the sealing member 101.

In other exemplary embodiments, the semiconductor package 13 may further include a second package 600 stacked on the first package as the fan out wafer level package. The second package 600 may be stacked on an upper redistribution wiring layer 130 of the first package via conductive connection members 650.

The conductive connection member 650 may be disposed between the second bonding pad 163 of the upper redistribution wiring layer 130 and a second connection pad 614 of the second package substrate 610. Accordingly, the first package and the second package 600 may be electrically connected to each other by the conductive connection members 650.

The second package may be substantially the same as or similar to the second package described with reference to FIG. 29. Thus, a detailed description thereof will be omitted as redundant.

Hereinafter, a method of manufacturing the semiconductor package of FIG. 31 will be described.

FIGS. 33 to 37 are cross-sectional views illustrating a method of manufacturing a semiconductor package in accordance with exemplary embodiments.

Figure 33:
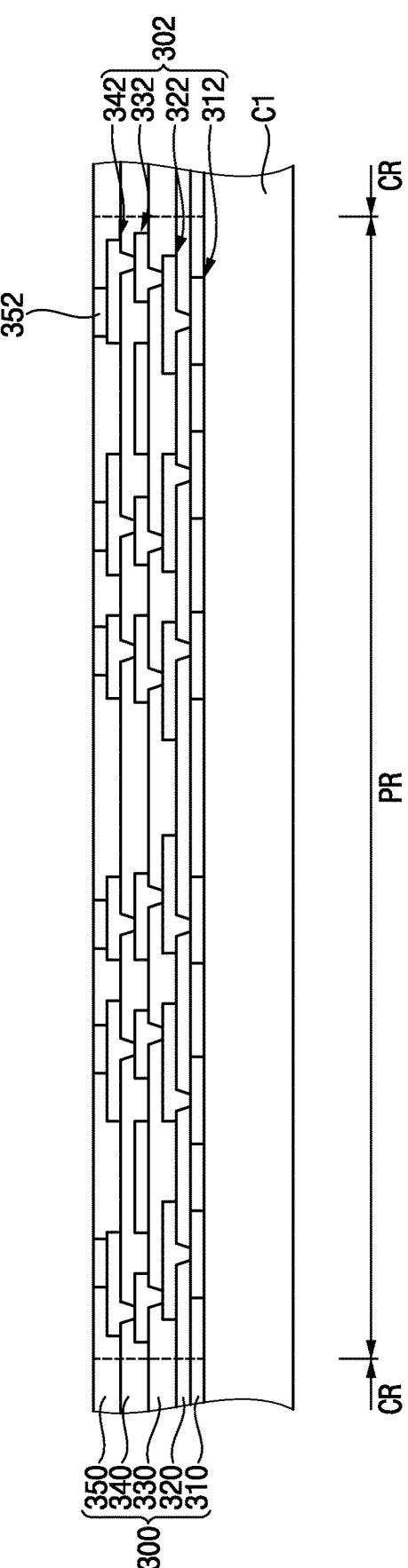

Referring to FIG. 33, a lower redistribution wiring layer 300 having first redistribution wirings 302 may be formed on a carrier substrate C1.

In exemplary embodiments, the carrier substrate C1 may include a wafer substrate serving as a base substrate for forming a sealing member on which a plurality of semiconductor chips is disposed and covering them. The carrier substrate C1 may have a shape corresponding to a wafer on which a semiconductor process is performed. For example, the carrier substrate C1 may include a silicon substrate, a glass substrate, a non-metal or metal plate, etc.

The carrier substrate C1 may include a package region PR on which the semiconductor chip is mounted and a cutting region CR surrounding the package region PR. As will be described later, the lower redistribution wiring layer 300 and the sealing member 101 formed on the carrier substrate C1 may be cut along the cutting region dividing the plurality of package regions to be individualized.

As illustrated in FIG. 33, a plating process may be performed on the carrier substrate C1 to form first lower redistribution wirings 312. Although not illustrated in the drawings, after sequentially forming a barrier metal layer, a seed layer and a photoresist layer on the carrier substrate C1, an exposure process may be performed on the photoresist layer to form a photoresist pattern having an opening that exposes a first lower redistribution region. Then, a plating process may be performed on the seed layer to form the first lower redistribution wirings. For example, the first lower redistribution wiring may include copper (Cu), aluminum (Al), tin (Sn), nickel (Ni), gold (Au), platinum (Pt), or any alloy thereof.

Then, after a first lower insulating layer 310 is formed on the carrier substrate C1 to cover the first lower redistribution wirings 312, the first lower insulating layer 310 may be patterned to form openings that expose the first lower redistribution wirings 312.

For example, the first lower insulating layer 310 may include a polymer or a dielectric layer. The first lower insulating layer 310 may include a photosensitive insulating material such as PID or an insulating film such as ABF. The first lower insulating layer may be formed by a spin coating process, a vapor deposition process, or the like.

Then, after a second lower insulating layer 320 is formed on the first lower insulating layer 310, second lower redistribution wirings 322 may be formed on the second lower insulating layer 320.

For example, after the second lower insulating layer 320 is formed to cover the first lower redistribution wirings 312, the second lower insulating layer 320 may be patterned to form openings that expose the first lower redistribution wirings 312 respectively. After a seed layer is formed on portions of the first lower redistribution wirings 312 and in the opening, the seed layer may be patterned and an electroplating process may be performed to form the second lower redistribution wirings 322. Accordingly, at least portions of the second lower redistribution wirings 322 may directly contact the first lower redistribution wirings 312 through the openings of the second lower insulating layer 320.

Similarly, after a third lower insulating layer 330 is formed on the second lower insulating layer 320, the third lower insulating layer 330 may be patterned to form openings that expose the second lower redistribution wirings 322. Then, third lower redistribution wirings 332 may be formed on the third lower insulating layer 330 to directly contact the second lower redistribution wirings 322 through the openings of the third lower insulating layer 330.

Then, after a fourth lower insulating layer 340 is formed on the third lower insulating layer 330, the fourth lower insulating layer 340 may be patterned to form openings that expose the third lower redistribution wirings 332. Then, fourth lower redistribution wirings 342 may be formed on the fourth lower insulating layer 340 to directly contact the third lower redistribution wirings 332 through the openings of the third lower insulating layer 340.

Then, first bonding pads 352 may be respectively formed on the fourth lower redistribution wirings 342. For example, a plating process may be performed on a redistribution pad of the fourth lower redistribution wiring 342 to form the first bonding pad 352.

Then, a solder resist layer 350 as a fifth lower insulating layer may be formed on the fourth lower insulating layer 340 to cover the fourth lower redistribution wirings 342 and expose at least a portion of the first bonding pad 352.

Thus, the lower redistribution wiring layer 300 having the first, second, third, fourth and fifth lower insulating layers 310, 320, 330, 340 and 350 may be formed. The first bonding pads 352 may be exposed from an upper surface of the lower redistribution wiring layer 300.

Figure 34:
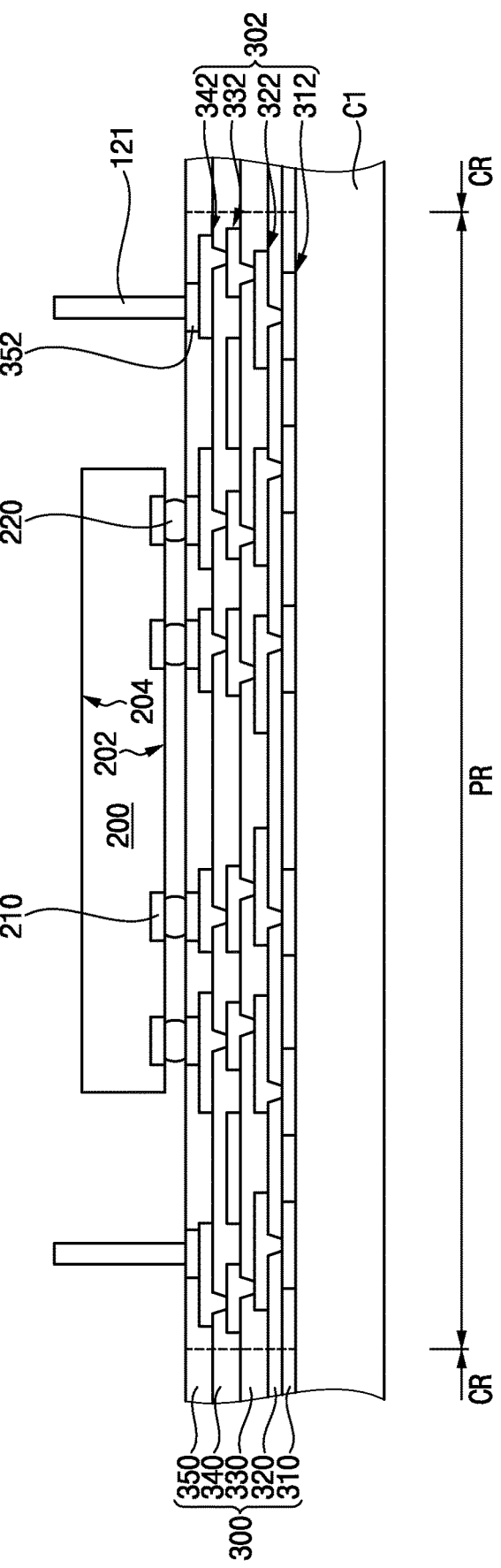
Figure 35:
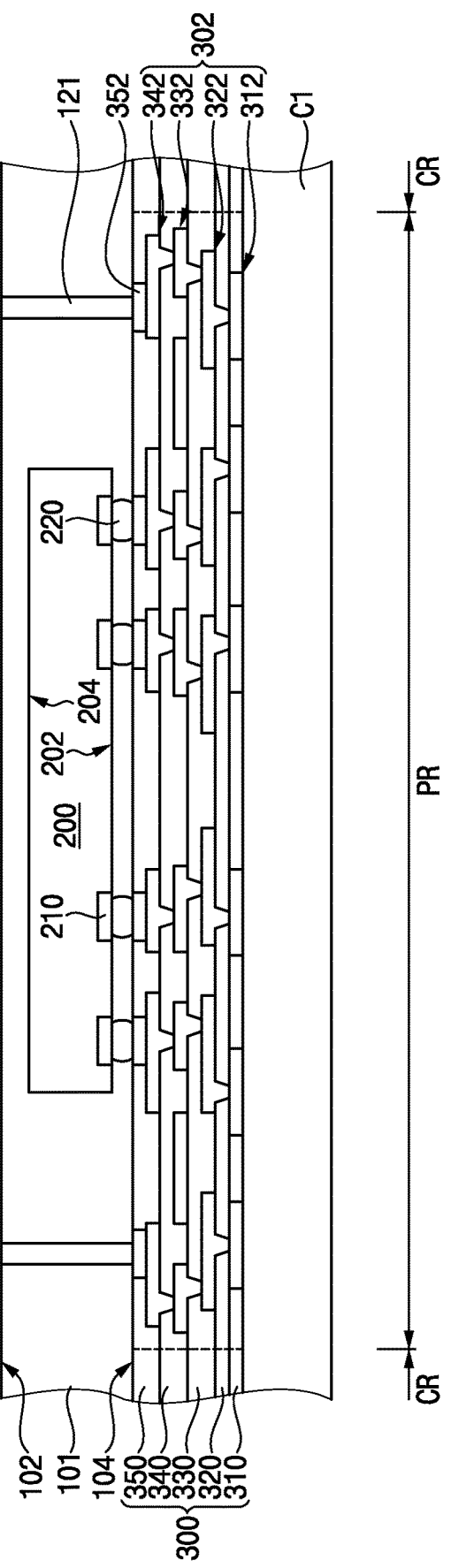

Referring to FIG. 34, conductive structures 121 may be formed on the lower redistribution wiring layer 300, a semiconductor chip 200 may be mounted on the lower redistribution wiring layer 300, and a sealing member 101 may be formed on the lower redistribution wiring layer 300 to cover the semiconductor chip 200 and the conductive structures 121.

For example, a photoresist pattern having through openings that expose upper surfaces of the first bonding pads 352 may be formed on the lower redistribution wiring layer 300, and the plurality of conductive structures 121 may be formed in the through openings. The conductive structure 121 may be formed on the first bonding pad 352. For example, the conductive structure 121 may be formed by a plating process, an electroless plating process, a vapor deposition process, or the like. The conductive structure 121 may have a pillar shape, a bump shape, etc.

Alternatively, after forming the sealing member 101 covering the semiconductor chip 200 on the lower redistribution wiring layer 300, the conductive structures 121 may be formed in the sealing member 101.

Then, the semiconductor chip 200 may be mounted on the lower redistribution wiring layer 300 by a flip chip bonding method. Chip pads 210 of the semiconductor chip 200 may be electrically connected to the first bonding pads 352 of the lower redistribution wiring layer 300 by conductive bumps 220. The conductive bumps 220 may include micro bumps (uBumps).

Then, the sealing member 101 may be formed on the carrier substrate C1 to cover the semiconductor chip 200 and the conductive structures 121.

In particular, the sealing member 101 may be formed on the lower redistribution wiring layer 300 to cover the semiconductor chip 200. For example, the sealing member 101 may include an epoxy molding compound (EMC) or an insulating film such as ABF. The sealing member 101 may be formed to cover an upper surface and a side surface of the semiconductor chip 200. An upper surface of the conductive structure 121 may be exposed from an upper surface of the sealing member 101.

In this exemplary embodiment, after forming the lower redistribution wiring layer 300 on the wafer substrate, the semiconductor chip 200 and the sealing member 101 may be formed on the lower redistribution wiring layer 300, however, it may not be limited thereto, and, for example, after stacking the semiconductor chip on the wafer substrate, the sealing member is formed to covering the semiconductor chip and the lower redistribution wiring layer having the first redistribution wirings electrically connected to the semiconductor chip may be formed on the sealing member.

Figure 36:
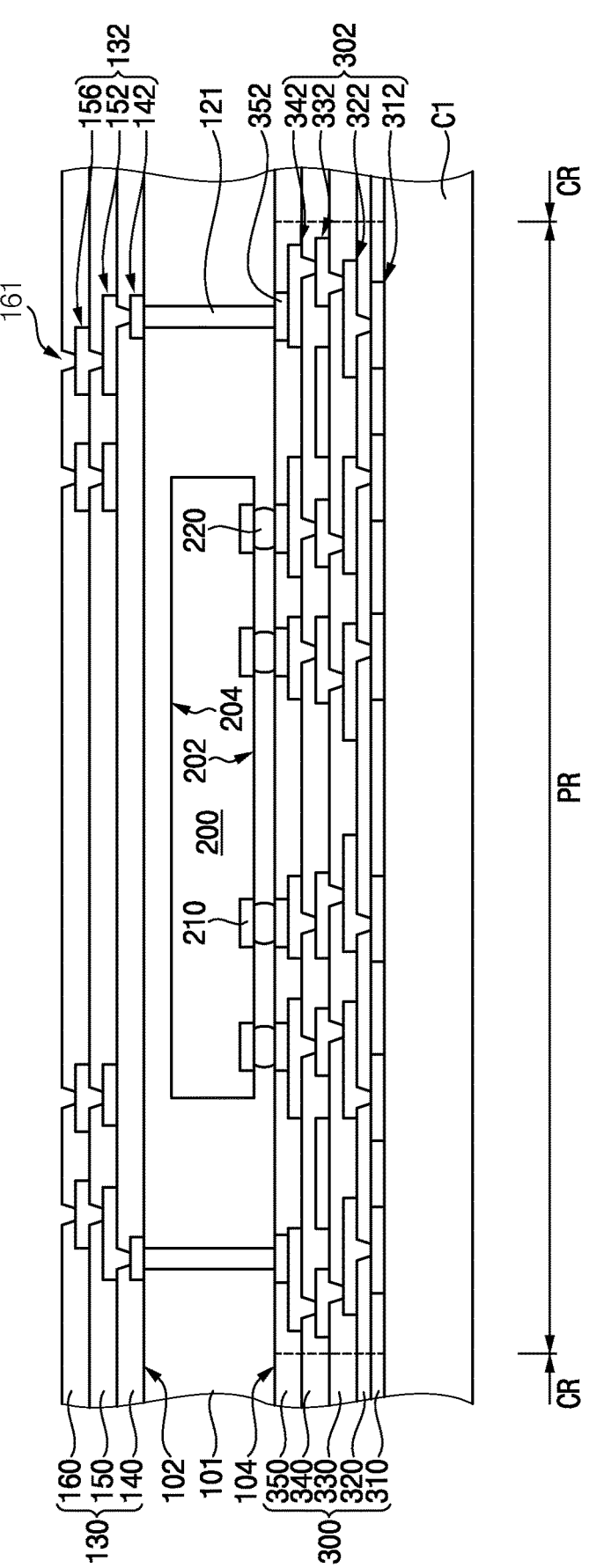
Figure 37:
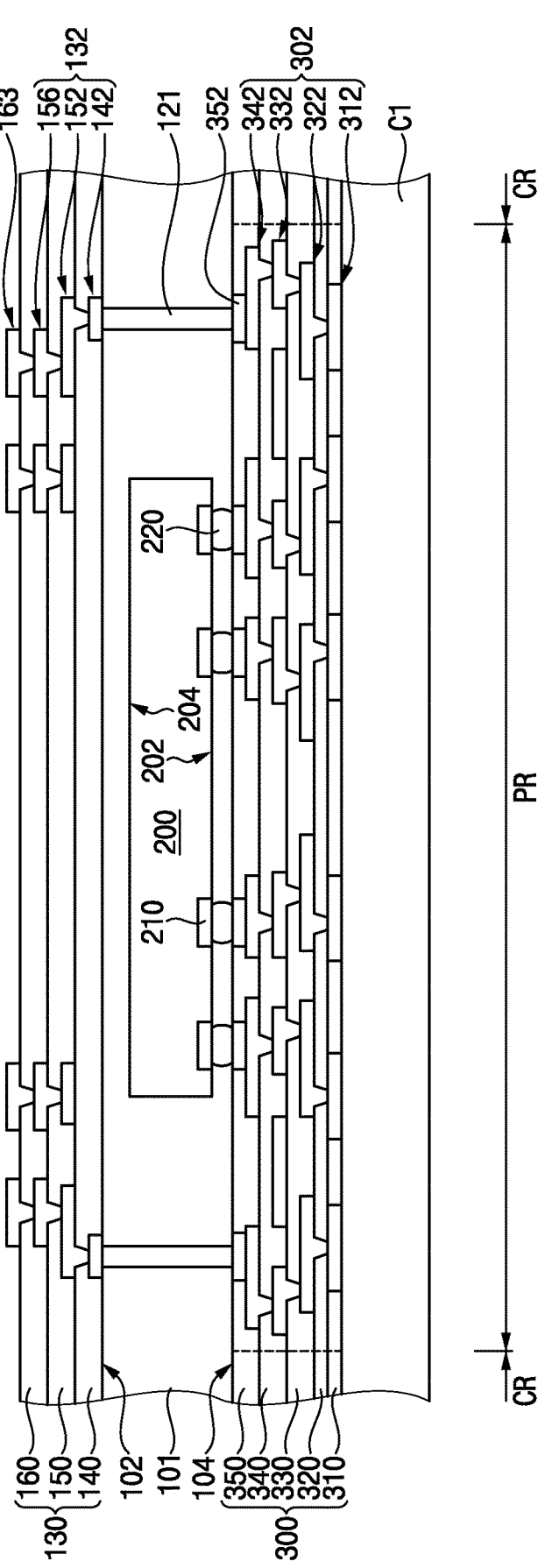

Referring to FIGS. 36 and 37, an upper redistribution wiring layer 130 having second redistribution wirings 132 electrically connected to the conductive structures 121 and second bonding pads 163 formed on a redistribution pad of an uppermost redistribution wiring 156 among the second redistribution wirings may be formed on the sealing member 101.

In particular, first upper redistribution wirings 142 may be formed on the sealing member 101 to be electrically connected to the conductive structures 120 respectively. The first upper redistribution wirings may be formed by forming a seed layer on the upper surface of the sealing member 101, patterning the seed layer and performing an electroplating process.

Then, after a first upper insulating layer 140 is formed on the sealing member 101, second upper redistribution wirings 152 may be formed on the first upper insulating layer 140.

For example, after the first upper insulating layer 140 is formed to cover the first upper redistribution wirings 142, the first upper insulating layer 140 may be patterned to form openings that expose the first upper redistributable wirings 142. After a seed layer is formed on portions of the first upper redistribution wirings 142 and in the opening, the seed layer may be patterned and an electroplating process may be performed to form the second upper redistribution wirings 152. Accordingly, at least portions of the second upper redistribution wirings 152 may directly contact the first upper redistribution wirings 142 through the openings of the first upper insulating layer.

Similarly, after a second upper insulating layer 150 is formed on the first upper insulating layer 140, the second upper insulating layer 150 may be patterned to form openings that expose the second upper redistribution wirings 152. Then, third upper redistribution wirings 156 may be formed on the second upper insulating layer 150 to directly contact the second upper redistribution wirings 152 through the openings of the second upper insulating layer.

Accordingly, the second redistribution wirings may include the first upper redistribution wiring 142, the second upper redistribution 152 and the third upper redistribution wiring 154 stacked in three layers. In this case, the third upper redistribution wiring 156 may correspond to an uppermost redistribution wiring among the second redistribution wirings.

Then, second bonding pads 163 may be respectively formed on the third upper redistribution wirings 154 as the uppermost redistribution wirings.

For example, processes that are same as or similar to the processes described with reference to FIGS. 11 to 19 may be performed to form the second bonding pad 163 on a redistribution pad of the third upper redistribution wiring 156.

A protective layer 160 may be provided on the second upper insulating layer 150 and may have an opening 161 that expose at least a portion of the uppermost redistribution wiring 156 of the second redistribution wirings 132.

The second bonding pad 163 may include a first pad portion provided in the opening 161 of the protective layer 160 and a second pad portion exposed from the opening 161 on the first pad portion. The second bonding pad 163 may include a first plating pattern 172, a second plating pattern 176 and a third plating pattern 178 sequentially stacked on the third upper redistribution wiring 156.

In particular, the first plating pattern 172 may include a via pattern 173 filling the opening 161 of the protective layer 160 and a pad pattern 174 exposed from the opening 1610 on the via pattern 173. The first plating pattern 172 may include the same material as the second upper redistribution wiring 152. For example, the first plating pattern 172 may include copper (Cu).

The second plating pattern 176 may be formed on the first plating pattern 172. For example, the second plating pattern 176 may include nickel (Ni). The third plating pattern 178 may be formed on the second plating pattern 176. For example, the third plating pattern 178 may include gold (Au).

Thus, the upper redistribution wiring layer 130 having the second redistribution wirings 142, 152 and 156 and the second bonding pads 163 may be formed.

Then, external connection members 400 (see FIG. 31) may be formed on an outer surface of the lower redistribution wiring layer 300 to be electrically connected to the first redistribution wirings 302.

Then, the lower redistribution wiring layers 300 may be individualized by a sawing process to complete a fan out wafer level package including the sealing member 101 as the base substrate, the lower redistribution wiring layer 300 formed on the lower surface of the sealing member 101 and the upper redistribution wiring layer 130 formed on the upper surface of the sealing member 101.

Then, as illustrated in FIG. 31, a second package 600 may be stacked on the first package as the fan out wafer level package via conductive connection members 650. The conductive connection member 650 may be disposed between the second bonding pad 163 of the upper redistribution wiring layer 130 and a second connection pad 614 of a second package substrate 610. Accordingly, the first package and the second package 600 may be electrically connected to each other by the conductive connection members 650.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing has been illustrative of exemplary embodiments and is not to be construed as limiting thereof. Although a few exemplary embodiments have been described, those skilled in the art will readily appreciate that many modifications are possible in such exemplary embodiments without materially departing from the novel teachings and advantages of the present invention. Accordingly, all such modifications are intended to be included within the scope of such exemplary embodiments as defined in the appended claims.

What is claimed is:

1. A semiconductor package, comprising:
a core substrate having a cavity;
a semiconductor chip disposed in the cavity of the core substrate and having chip pads provided on a front surface of the semiconductor chip;
a lower redistribution wiring layer covering a first surface of the core substrate, the lower redistribution wiring layer having first redistribution wirings electrically connected to the chip pads;
a sealing layer covering a second surface of the core substrate opposite to the first surface, the sealing layer filling the cavity;
at least one upper insulating layer provided on the sealing layer, the at least one upper insulating layer having second redistribution wirings electrically connected to conductive structures of the core substrate;
a protective layer provided on the at least one upper insulating layer, the protective layer having an opening that exposes at least a portion of an uppermost redistribution wiring among the second redistribution wirings; and
a bonding pad provided on the protective layer and electrically connected to the uppermost redistribution wiring through the opening of the protective layer,
wherein the bonding pad includes,
a first plating pattern formed on the uppermost redistribution wiring, the first plating pattern including a via pattern provided in the opening and a pad pattern formed on the via pattern to be exposed from the opening;
a second plating pattern formed on the first plating pattern; and
a third plating pattern formed on the second plating pattern,
wherein the second plating pattern covers an upper surface and a side surface of the first plating pattern exposed through the opening.

2. The semiconductor package of claim 1, wherein the via pattern has a first diameter, and the pad pattern has a second diameter greater than the first diameter.

3. The semiconductor package of claim 2, wherein the second plating pattern has a third diameter the same as the second diameter.

4. The semiconductor package of claim 1, wherein the first plating pattern includes the same material as the uppermost redistribution wiring.

5. The semiconductor package of claim 4, wherein the first plating pattern includes copper.

6. The semiconductor package of claim 1, wherein the second plating pattern includes nickel (Ni), and the third plating pattern includes gold (Au).

7. The semiconductor package of claim 1, wherein a thickness of the protective layer is within a range of 10 μm to 20 μm.

8. The semiconductor package of claim 1, wherein a diameter of the opening of the protective layer is within a range of 50 μm to 250 μm.

9. The semiconductor package of claim 1, wherein the first plating pattern has a first thickness, the second plating pattern has a second thickness less than the first thickness, and the third plating pattern has a third thickness less than the second thickness.

10. A semiconductor package, comprising:
at least one semiconductor chip;
a frame surrounding the at least one semiconductor chip and having conductive connectors;
a lower redistribution wiring layer arranged on a lower surface of the frame and having first redistribution wirings electrically connected to chip pads of the at least one semiconductor chip and the conductive connectors; and
an upper redistribution wiring layer arranged on an upper surface of the frame, the upper redistribution wiring layer including at least one upper insulating layer on the frame having second redistribution wirings electrically connected to the conductive connectors of the frame, a protective layer provided on the at least one upper insulating layer and having an opening that exposes at least a portion of an uppermost redistribution wiring among the second redistribution wirings, and a bonding pad provided on the protective layer and electrically connected to the uppermost redistribution wiring through the opening of the protective layer,
wherein the bonding pad includes:
a first plating pattern having a via pattern filling the opening of the protective layer and a pad pattern exposed from the opening on the via pattern,
a second plating pattern on the first plating pattern, and
a third plating pattern on the second plating pattern, and
wherein the second plating pattern covers an upper surface and a side surface of the first plating pattern exposed through the opening.

11. The semiconductor package of claim 10, wherein the via pattern has a first diameter, and the pad pattern has a second diameter greater than the first diameter.

12. The semiconductor package of claim 11, wherein the second plating pattern has a third diameter the same as the second diameter.

13. The semiconductor package of claim 10, wherein the second plating pattern includes nickel (Ni), and the third plating pattern includes gold (Au).

14. The semiconductor package of claim 10, wherein a thickness of the protective layer is within a range of 10 μm to 20 μm.

15. The semiconductor package of claim 10, wherein a diameter of the opening of the protective layer is within a range of 50 μm to 250 μm.

16. A semiconductor package, comprising:
a lower redistribution wiring layer including first redistribution wirings;
a semiconductor chip disposed on the lower redistribution wiring layer and electrically connected to the first redistribution wirings;

a support member surrounding the semiconductor chip on the lower redistribution wiring layer; and an upper redistribution wiring layer disposed on the support member, the upper redistribution wiring layer including a sealing layer covering the semiconductor chip, at least one upper insulating layer on the sealing layer having second redistribution wirings electrically connected to conductive structures of the support member, a protective layer provided on the at least one upper insulating layer and having an opening that exposes at least a portion of an uppermost redistribution wiring among the second redistribution wirings, and a bonding pad provided on the protective layer and electrically connected to the uppermost redistribution wiring through the opening of the protective layer, wherein the bonding pad includes, a first plating pattern formed on the uppermost redistribution wiring, the first plating pattern including a via pattern provided in the opening and a pad pattern formed on the via pattern to be exposed from the opening;

a second plating pattern formed on the first plating pattern; and a third plating pattern formed on the second plating pattern, wherein the second plating pattern covers an upper surface and a side surface of the first plating pattern exposed through the opening.

* * * * *